(12) United States Patent
Mishra et al.

(10) Patent No.: US 12,068,206 B2
(45) Date of Patent: Aug. 20, 2024

(54) EXTENSION OF NANOCOMB TRANSISTOR ARRANGEMENTS TO IMPLEMENT GATE ALL AROUND

(71) Applicant: Intel Corporation, Santa Clara, CA (US)

(72) Inventors: Varun Mishra, Hillsboro, OR (US);
Stephen M. Cea, Hillsboro, OR (US);
Cory E. Weber, Hillsboro, OR (US);
Jack T. Kavalieros, Portland, OR (US);
Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 718 days.

(21) Appl. No.: 17/030,449

(22) Filed: Sep. 24, 2020

(65) Prior Publication Data

US 2022/0093474 A1    Mar. 24, 2022

(51) Int. Cl.
| | | |
|---|---|---|
| H01L 23/00 | (2006.01) | |
| H01L 21/84 | (2006.01) | |
| H01L 29/06 | (2006.01) | |
| H01L 29/423 | (2006.01) | |
| H01L 29/78 | (2006.01) | |
| H10B 51/10 | (2023.01) | |
| H10B 51/30 | (2023.01) | |

(52) U.S. Cl.
CPC ........ *H01L 21/845* (2013.01); *H01L 29/0673* (2013.01); *H01L 29/42392* (2013.01); *H01L 29/78391* (2014.09); *H01L 29/7853* (2013.01); *H10B 51/10* (2023.02); *H10B 51/30* (2023.02)

(58) Field of Classification Search
CPC ............... H01L 21/845; H01L 29/0673; H01L 29/42392
See application file for complete search history.

(56) References Cited

U.S. PATENT DOCUMENTS

| | | | |
|---|---|---|---|
| 2020/0118996 A1* | 4/2020 | Parikh | H01L 27/0688 |
| 2021/0280708 A1* | 9/2021 | Wei | H01L 29/785 |
| 2021/0384299 A1* | 12/2021 | Ma | H01L 27/0886 |

OTHER PUBLICATIONS

Weckx, P., et al., "Novel Forksheet Device Architecture as Ultimate Logic Scaling Device Towards 2nm," IEEE; 4 pages (2019).

* cited by examiner

*Primary Examiner* — Anthony Ho
(74) *Attorney, Agent, or Firm* — Akona IP PC

(57) ABSTRACT

Embodiments of the present disclosure are based on extending a nanocomb transistor architecture to implement gate all around, meaning that a gate enclosure of at least a gate dielectric material, or both a gate dielectric material and a gate electrode material, is provided on all sides of each nanoribbon of a vertical stack of lateral nanoribbons of a nanocomb transistor arrangement. In particular, extension of a nanocomb transistor architecture to implement gate all around, proposed herein, involves use of two dielectric wall materials which are etch-selective with respect to one another, instead of using only a single dielectric wall material used to implement conventional nanocomb transistor arrangements. Nanocomb-based transistor arrangements implementing gate all around as described herein may provide improvements in terms of the short-channel effects of conventional nanocomb transistor arrangements.

20 Claims, 17 Drawing Sheets

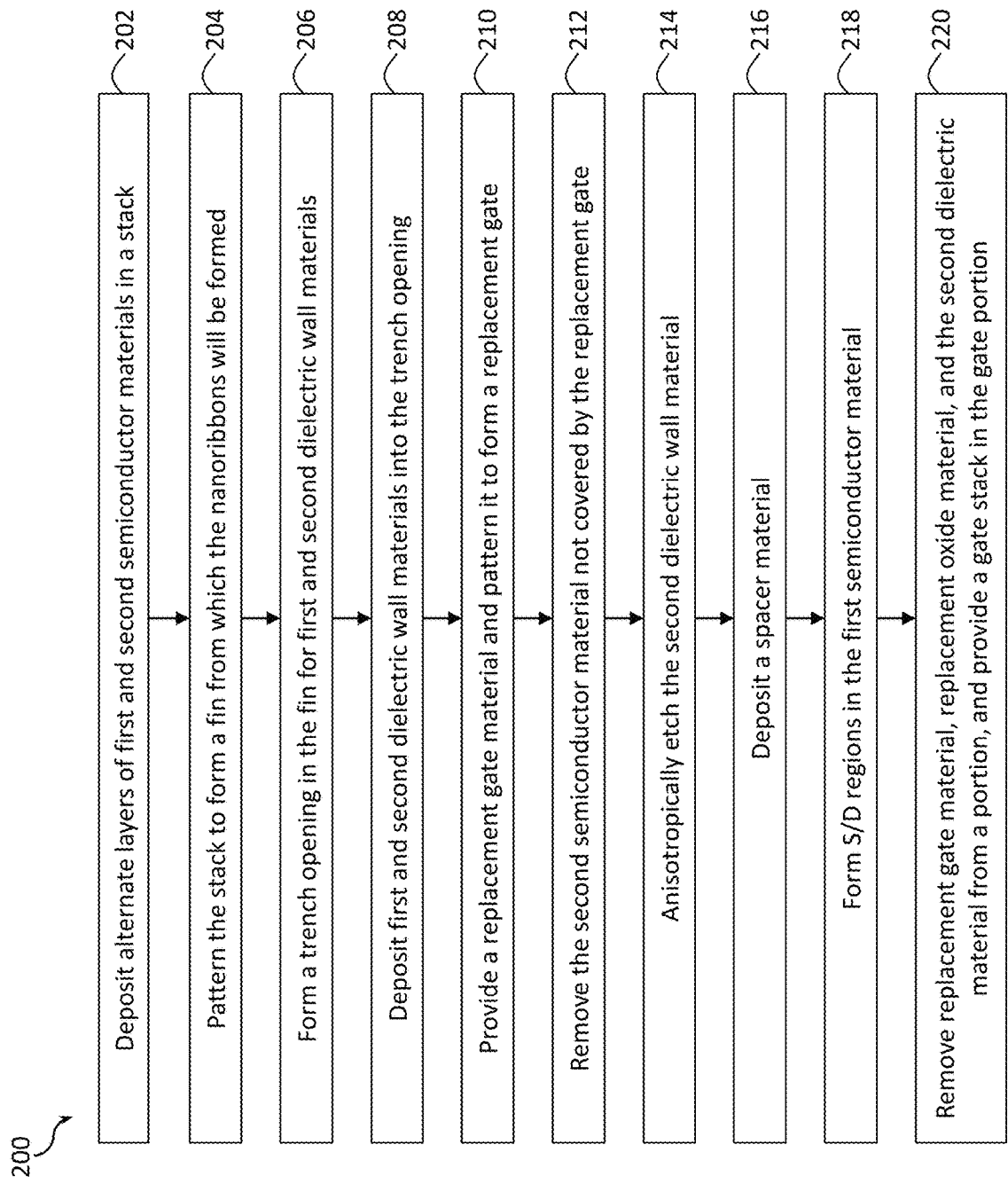

EXTENSION OF NANOCOMB TRANSISTOR ARRANGEMENTS TO IMPLEMENT GATE ALL AROUND

TECHNICAL FIELD

This disclosure relates generally to the field of semiconductor devices, and more specifically, to nanocomb transistor arrangements.

BACKGROUND

For the past sever al decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 is a flow diagram of an example method of manufacturing a nanocomb-based transistor arrangement implementing gate all around, in accordance with some embodiments.

FIGS. 3A-3J provide top-down and cross-sectional side views at various stages in the manufacture of an example nanocomb-based transistor arrangement implementing gate all around according to the method of FIG. 2, in accordance with some embodiments.

DETAILED DESCRIPTION

Overview

Figure 1:
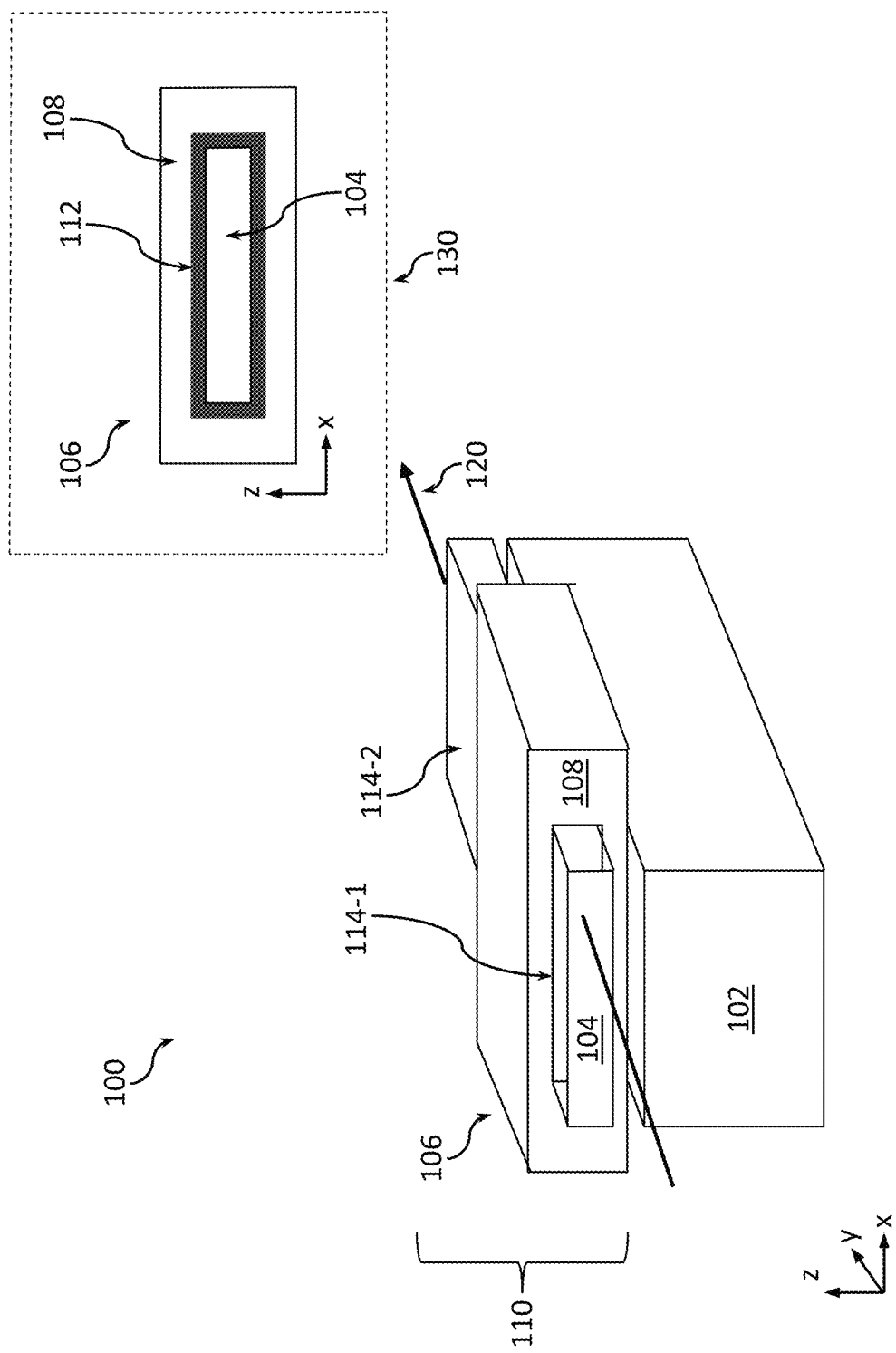
FIG. 1 provides a perspective view of an example nanoribbon-based field-effect transistor (FET), in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating nanocomb-based transistor arrangement implementing gate all around, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

Non-planar transistors such as double-gate transistors, trigate transistors, FinFETs, nanowire, and nanoribbon transistors refer to transistors having a non-planar architecture. In comparison to a planar architecture where the transistor channel has only one confinement surface, a non-planar architecture is any type of architecture where the transistor channel has more than one confinement surfaces. A confinement surface refers to a particular orientation of the channel surface that is confined by the gate field. Non-planar transistors potentially improve performance relative to transistors having a planar architecture, such as single-gate transistors.

A gate enclosure of a transistor refers to a portion of the gate stack which sets the amount of a "top-down" space that a gate stack consumes beyond the channel confinement surface. Conventional non-planar transistor architectures all utilize gate enclosures that not only consume space but also add parasitic capacitance, impacting area scaling, speed improvements, and energy savings. A nanocomb transistor architecture (also sometimes referred to as a forksheet architecture) has been proposed in the literature as a scaling booster to reduce the cell dimensions and parasitic capacitance, where the name "nanocomb/forksheet" arises because of its complex bilateral finned structure. In a conventional nanocomb transistor arrangement, there is no gate enclosure on one of the two sides of the vertical stack of lateral nanoribbons or nanosheets (referred to in the following as "nanoribbons"), while the gate enclosure on the other side still remains.

In some implementations, lack of gate enclosure on one of the two sides of the vertical stack of lateral nanoribbons may result in non-negligible short-channel effects. Embodiments of the present disclosure are based on extending a nanocomb transistor architecture to implement gate all around, meaning that a gate enclosure of at least a gate dielectric material, or both a gate dielectric material and a gate electrode material, is provided on all sides of each nanoribbon of a vertical stack of lateral nanoribbons of a nanocomb transistor arrangement. In particular, extension of a nanocomb transistor architecture to implement gate all around, proposed herein, involves use of two dielectric wal materials which are etch-selective with respect to one another, instead of using only a single dielectric wall material used to implement conventional nanocomb transistor arrangements. As known in the art, two materials are said to be "etch-selective" (or said to have "sufficient etch selectivity") with respect to one another when etchants used to etch one material do not substantially etch the other, enabling selective etching of one material but not the other. Nanocomb-based transistor arrangements implementing gate all around as described herein may provide improvements in terms of the short-channel effects of conventional nanocomb transistor arrangements.

As used herein, the term "nanoribbon" refers to an elongated semiconductor structure having a long axis parallel to a support structure (e.g., a substrate, a chip, or a wafer) over which a transistor arrangement is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular or square-like transverse cross-section. In the present disclosure, the term "nanoribbon" is used to describe both such nanoribbons (including nanosheets) and nanowires, as well as elongated semiconductor structures with a longitudinal axis parallel to the support structures and with having transverse cross-sections of any geometry (e.g., oval, or a polygon with rounded corners). As used herein, the term "face of a nanoribbon" refers to any of the confinement surfaces (i.e., interfaces of the semiconductor material of the nanoribbon with the gate stack) of the nanoribbon which are substantially parallel to the support structure when a nanoribbon extends in a direction parallel to the support structure, while the term "sidewall of a nanoribbon" refers to any of the confinement surfaces of the nanoribbon connecting the bottom face and the top face (the bottom face being the face of the nanoribbon that is closer to the support structure than the top face). In one aspect of the present disclosure, an example nanoribbon transistor arrangement includes a channel material shaped as a nanoribbon, and a gate stack wrapping around at least a portion of a first (e.g., bottom) face of the nanoribbon, both sidewalls, and a portion of a second (e.g., top) face of the nanoribbon.

While the descriptions are provided herein with reference to nanoribbons, the principles of extending nanocomb-based transistor arrangement to implement gate all around, described herein, are equally applicable to arrangements where a channel material is shaped as a structure where the length of the structure (e.g., a dimension measured along the y-axis of the example coordinate system shown in the present drawings) is similar to the thickness of the structure (e.g., a dimension measured along the z-axis of the example coordinate system shown in the present drawings).

Various IC devices with one or more nanocomb-based transistor arrangements implementing gate all around as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4C, such a collection may be referred to herein without the letters, e.g., as "FIG. 4."

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more nanocomb-based transistor arrangements implementing gate all around as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. In another example, a term "interconnect" is used to describe any element formed of an electrically conductive material for providing electrical connectivity to one or more components associated with an IC or/and between various such components. The terms "substantially," "close," "approximately," "near," and "about," generally refer to being within +/−20% of a target value based on the context of a particular value as described herein or as known in the art.

Example Nanoribbon Transistor Arrangement

FIG. 1 provides a perspective view of an example IC structure with a nanoribbon-based field-effect transistor (FET) 110 that may be adapted to form a nanocomb-based transistor arrangement implementing gate all around, in accordance with various embodiments. For example, in various embodiments, the transistor 110 formed on the basis of a nanoribbon 104, shown in FIG. 1, may be formed on the basis of any of the nanoribbons 390 of the nanocomb-based transistor arrangements shown in FIG. 3J or any of FIGS. 4A-4C, except that the transistors formed therein would be formed in the stacks of lateral nanoribbons separated by a dielectric wall that was formed using first and second dielectric wall materials, as described herein.

Turning to the details of FIG. 1, the arrangement 100 may include a channel material formed as a nanoribbon 104 made of one or more semiconductor materials, the nanoribbon 104 provided over a support structure 102. The transistor 110 may be formed on the basis of the nanoribbon 104 by having a gate stack 106 wrap around at least a portion of the nanoribbon referred to as a "channel portion" and by having source and drain regions, shown in FIG. 1 as a first source or drain (S/D) region 114-1 and a second S/D region 114-2 on either side of the gate stack 106. In some embodiments, a layer of oxide material (not specifically shown in FIG. 1) may be provided between the support structure 102 and the gate stack 106.

The arrangement 100 shown in FIG. 1 (and other figures of the present disclosure) is intended to show relative arrangements of some of the components therein, and the arrangement 100, or portions thereof, may include other components that are not illustrated (e.g., electrical contacts to the S/D regions 114 of the transistor 110, additional layers such as a spacer layer around the gate electrode of the transistor 110, etc.). For example, although not specifically illustrated in FIG. 1, a dielectric spacer may be provided between the source electrode and the gate stack as well as between the transistor drain electrode and the gate stack of the transistor 110 in order to provide electrical isolation between the source, gate, drain electrodes. In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Implementations of the present disclosure may be formed or carried out on any suitable support structure 102, such as a substrate, a die, a wafer, or a chip. The support structure 102 may, e.g., be the wafer 2000 of FIG. 5A, discussed below, and may be, or be included in, a die, e.g., the singulated die 2002 of FIG. 5B, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which a semiconductor device implementing any of the nanocomb-based transistor arrangements implementing gate all around as described herein may be built falls within the spirit and scope of the present disclosure.

The nanoribbon 104 may take the form of a nanowire or nanoribbon, for example. In some embodiments, an area of a transversal cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). In some embodiments, a width of the nanoribbon 104 (i.e., a dimension measured in a plane parallel to the support structure 102 and in a direction perpendicular to a long axis 120 of the nanoribbon 104, e.g., along the y-axis of the example coordinate system shown in FIG. 1) may be at least about 3 times larger than a height of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger. Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. Furthermore, although FIG. 1, as well as FIGS. 3 and 4, depict embodiments in which the longitudinal axis 120 of the nanoribbon 104 runs substantially parallel to the plane of the support structure 102, this need not be the case; in other embodiments, the nanoribbon 104 may be oriented, e.g., "vertically" so as to be perpendicular to the support structure 102. For any orientation of the nanoribbon 104 with respect to the support structure 102, a "face" of a nanoribbon refers to the side of the nanoribbon that is larger than the side perpendicular to it (when measured in a plane substantially perpendicular to the long axis 120 of the nanoribbon 104), the latter side being referred to as a "sidewall" of a nanoribbon.

In some embodiments, the channel material of the nanoribbon 104 may be composed of semiconductor material systems including, for example, N-type or P-type materials systems. In some embodiments, the channel material of the nanoribbon 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the nanoribbon 104 may include a combination of semiconductor materials. In some embodiments, the channel material of the nanoribbon 104 may include a monocrystalline semiconductor, such as silicon (Si) or germanium (Ge). In some embodiments, the channel material of the nanoribbon 104 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an NMOS transistor), the channel material of the nanoribbon 104 may advantageously include a III-V material having a high electron mobility, such as, but not limited to InGaAs, InP, InSb, and InAs. For some such embodiments, the channel material of the nanoribbon 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material of the nanoribbon 104 may be an intrinsic III-V material, i.e., a III-V semiconductor material not intentionally doped with any electrically active impurity. In alternate embodiments, a nominal impurity dopant level may be present within the channel material of the nanoribbon 104, for example to further fine-tune a threshold voltage Vt, or to provide HALO pocket implants, etc. Even for impurity-doped embodiments however, impurity dopant level within the channel material of the nanoribbon 104 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 110 is a PMOS transistor), the channel material of the nanoribbon 104 may advantageously be a group IV material having a high hole mobility, such as, but not limited to Ge or a Ge-rich SiGe alloy. For some example embodiments, the channel material of the nanoribbon 104 may have a Ge content between 0.6 and 0.9, and advantageously may be at least 0.7. In some embodiments with highest mobility, the channel material of the nanoribbon 104 may be intrinsic III-V (or IV for P-type devices) material and not intentionally doped with any electrically active impurity. In alternate embodiments, one or more a nominal impurity dopant level may be present within the channel material of the nanoribbon 104, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the channel material of the nanoribbon 104 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 104 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 104 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

A gate stack 106 including a gate electrode material 108 and, optionally, a gate dielectric material 112, may wrap entirely or almost entirely around a portion of the nanoribbon 104 as shown in FIG. 1, with the active region (channel region) of the channel material of the transistor 110 corresponding to the portion of the nanoribbon 104 wrapped by the gate stack 106. The gate dielectric material 112 is not shown in the perspective drawing of the arrangement 100 shown in FIG. 1, but is shown in an inset 130 of FIG. 1, providing a cross-sectional side view of a portion of the nanoribbon 104 with a gate stack 106 wrapping around it. As shown in FIG. 1, the gate dielectric material 112 may wrap around a transversal portion of the nanoribbon 104 and the gate electrode material 108 may wrap around the gate dielectric material 112.

The gate electrode material 108 may include at least one P-type work function metal or N-type work function metal, depending on whether the transistor 110 is a P-type metal-oxide-semiconductor (PMOS) transistor or an N-type metal-oxide-semiconductor (NMOS) transistor (P-type work function metal used as the gate electrode material 108 when the transistor 110 is a PMOS transistor and N-type work function metal used as the gate electrode material 108 when the transistor 110 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric material 112 may include one or more high-k dielectrics including any of the materials discussed herein with reference to the insulator material that may surround portions of the transistor 110. In some embodiments, an annealing process may be carried out on the gate dielectric material 112 during manufacture of the transistor 110 to improve the quality of the gate dielectric material 112. The gate dielectric material 112 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, e.g., when the transistor 110 is a storage transistor of a memory cell, the gate dielectric 112 may be replaced with, or complemented with a layer of a ferroelectric material. Such a ferroelectric material may include one or more materials which exhibit sufficient ferroelectric or antiferroelectric behavior even at thin dimensions. Some examples of such materials known at the moment include hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and yttrium-doped (Y-doped) hafnium oxide. However, in other embodiments, any other materials which exhibit ferroelectric or antiferroelectric behavior at thin dimensions may be used to replace, or to complement, the gate dielectric 112 when the transistor 110 is a storage transistor, and are within the scope of the present disclosure. The ferroelectric material included in the gate stack 106 when the transistor 110 is a storage transistor, may have a thickness that may, in some embodiments, be between about 0.5 nanometers and 10 nanometers, including all values and ranges therein (e.g., between about 1 and 8 nanometers, or between about 0.5 and 5 nanometers).

As further shown in FIG. 1, the nanoribbon 104 may include a source region and a drain region on either side of the gate stack 106, thus realizing a transistor. As is well known in the art, source and drain (S/D) regions are formed for the gate stack of each MOS transistor. As described above, the source and drain regions of a transistor are interchangeable, and a nomenclature of a first S/D region and a second S/D region of an access transistor has been introduced for use in the present disclosure. In FIG. 1, reference numeral 114-1 is used to label the first S/D region, S/D1, and reference numeral 114-2 is used to label the second S/D region, S/D2, of the transistor 110.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

Example Fabrication of Nanocomb-Based Transistor Arrangements with Gate All Around The nanoribbon 104 may form a basis for forming nanocomb-based transistor arrangements implementing gate all around.

FIG. 2 is a flow diagram of an example method 200 of manufacturing a nanocomb-based transistor arrangement implementing gate all around, in accordance with some embodiments. Although the operations of the method 200 are illustrated once each and in a particular order, the operations may be performed in any suitable order and repeated as desired. For example, one or more operations may be performed in parallel to manufacture multiple nanocomb-based transistor arrangements implementing gate all around substantially simultaneously. In another example, the operations may be performed in a different order to reflect the structure of an IC device in which the nanocomb-based transistor arrangements implementing gate all around will be included.

In addition, the example manufacturing method 200 may include other operations not specifically shown in FIG. 2, such as various cleaning or planarization operations as known in the art. For example, in some embodiments, the support structure 102, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

FIGS. 3A-3J provide top-down and cross-sectional side views of IC structures at various stages in the manufacture of an example nanocomb-based transistor arrangement implementing gate all around according to the method 200 of FIG. 2, in accordance with some embodiments. Each of FIGS. 3A-3J provides a top-down view (i.e., a view in the x-y plane of the example coordinate system shown in FIGS. 1, 3, and 4) and at least one cross-sectional side view (i.e., a view in the x-z plane of the example coordinate system shown in FIGS. 1, 3, and 4) of the respective transistor arrangements. The cross-sectional side views of FIGS. 3A-3J illustrate cross-sections taken along different x-z planes of the respective transistor arrangements. In particular, the only cross-sectional side view shown in FIGS. 3A-3E is a cross-section taken along a plane AA shown with a dashed line in the top-down view shown in FIGS. 3A-3E (the plane AA being substantially perpendicular to the page of the drawing and including the dashed line shown in the top-down view of FIGS. 3A-3E), while FIGS. 3F-3J not only illustrate the cross-sections taken along the plane AA, but also illustrate cross-sections taken along a plane BB shown with a dashed line in the top-down view shown in FIGS. 3F-3J (the plane BB being substantially perpendicular to the page of the drawing and including the dashed line shown in the top-down view of FIGS. 3F-3J).

A number of elements referred to in the description of FIGS. 3A-3J with reference numerals are illustrated in these figures with different patterns, with a legend showing the correspondence between the reference numerals and patterns being provided at the bottom of each drawing page containing FIGS. 3A-3J. For example, the legend illustrates that FIGS. 3A-3J use different patterns to show a support structure 332, a first semiconductor material 334, a second semiconductor material 336, a first dielectric wall material 338, a second dielectric wall material 340, and so on. Furthermore, although a certain number of a given element may be illustrated in some of FIGS. 3A-3J (e.g., two stacks of nanoribbons 390, with four nanoribbons 390 in each stack), this is simply for ease of illustration, and more, or less, than that number may be included in other nanocomb-based transistor arrangements implementing gate all around according to various embodiments of the present disclosure. Still further, various views shown in FIGS. 3A-3J are intended to show relative arrangements of various elements therein, and that various nanocomb-based transistor arrangements implementing gate all around, or portions thereof, may include other elements or components that are not illustrated (e.g., transistor portions, various components that may be in electrical contact with any of the transistor portions, etc.).

Figure 3A:
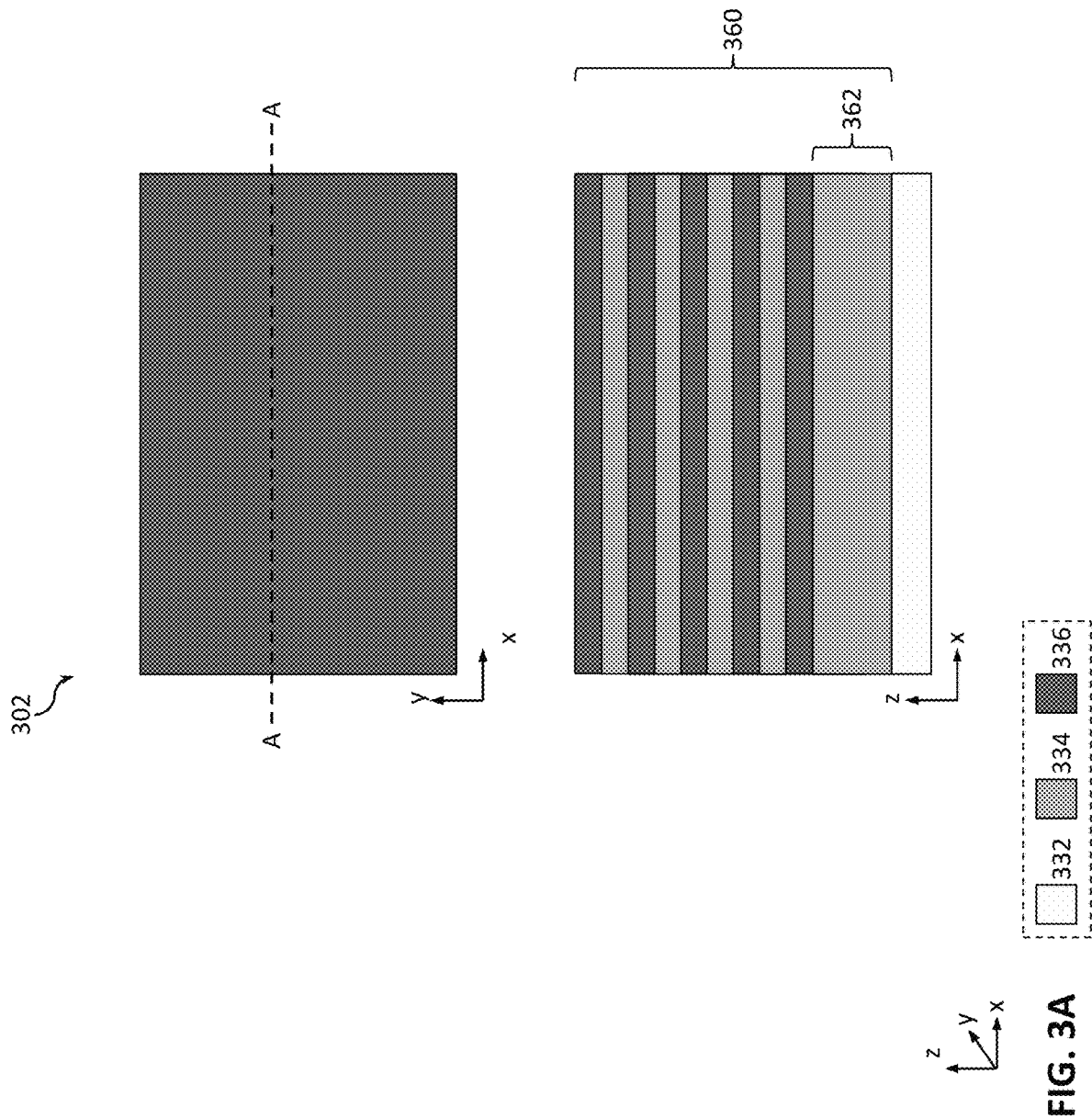

The method 200 may begin with a process 202 that includes providing alternate layers of first and second semiconductor materials in a stack. An IC structure 302 of FIG. 3A illustrates an example result of performing the process 202. The IC structure 302 includes a support structure 332 and alternate layers of a first semiconductor material 334 and a second semiconductor material 336 forming a stack 360. As shown in FIG. 3A, in some embodiments, the alternation of layers of the first semiconductor material 334 and the second semiconductor material 336 may begin after, first, a base 362 of the first semiconductor material 334 is provided over the support structure 332. In various embodiments, the support structure 332 may be the support structure 102, described above. The first semiconductor material 334 may be the channel material described with reference to the nanoribbon 104, described above. The second semiconductor material 336 may be any suitable material that is etch-selective with respect to the first semiconductor material 334 in order to be able to etch, in a later process, the second semiconductor material 336 to form nanoribbons of the first semiconductor material 334. For example, in some embodiments, the first semiconductor material 334 may be silicon while the second semiconductor material 336 may be silicon germanium. Providing the alternate layers of the first semiconductor material 334 and the second semiconductor material 336 in the process 202 may include epitaxially growing layers of the first semiconductor material 334 and the second semiconductor material 336 using any of the techniques known in the art.

Figure 3B:
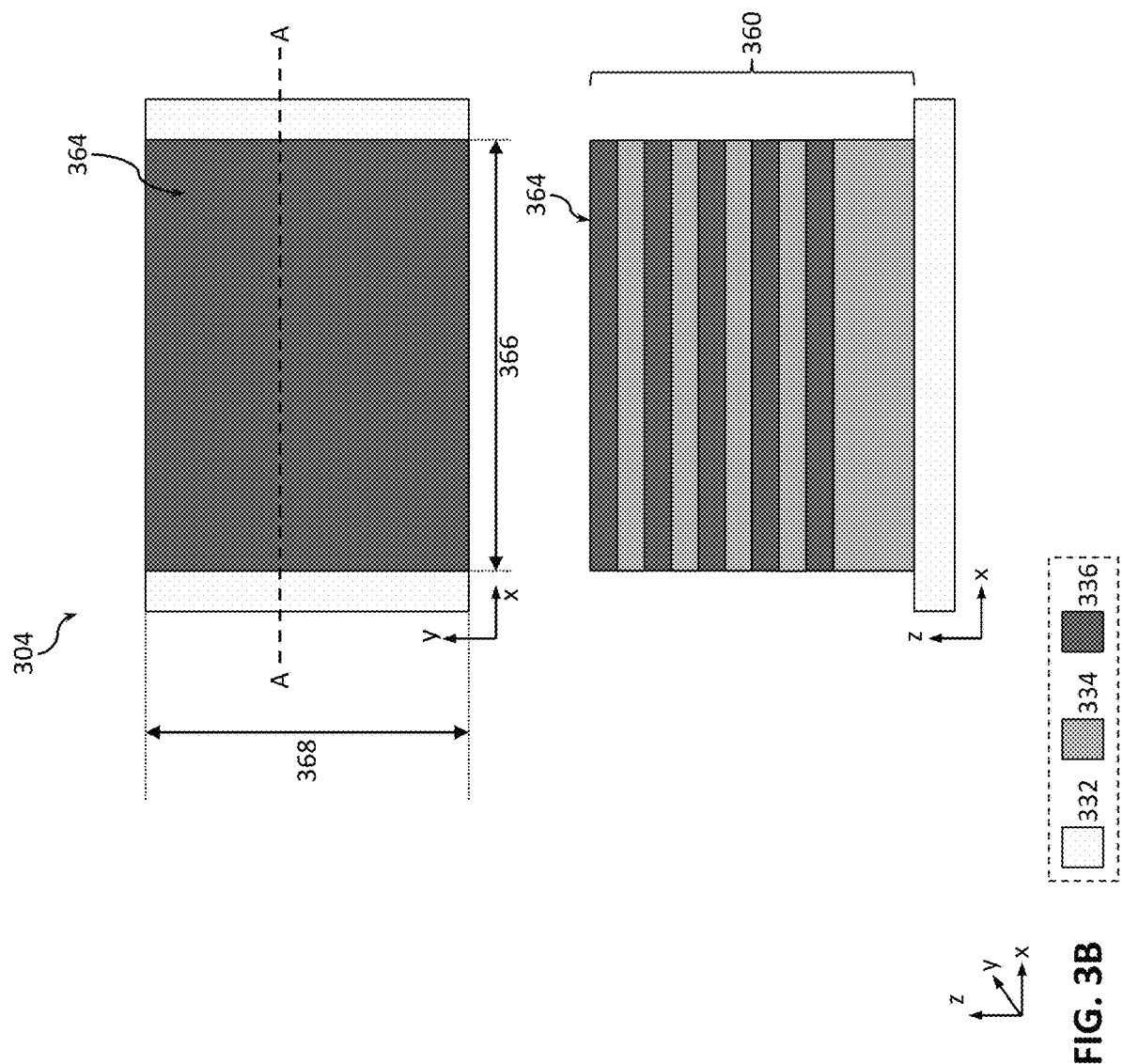

A process 204 of the method may include patterning the stack formed in the process 202 to form a fin from which the nanoribbons of the nanocomb-based transistor arrangement may later be formed. An IC structure 304 of FIG. 3B illustrates an example result of performing the process 204 on the IC structure 302. The IC structure 304 illustrates that the stack 360 has been shaped to form a fin 364. The fin 364 may be shaped as a structure that extends away from the support structure 332, and having a width 366 (i.e., a dimension measured along the x-axis of the example coordinate system shown) that is suitable to account for two times the width of the future nanoribbons (e.g., as described above with reference to the width of the nanoribbon 104) and the width of the trench opening for the first and second dielectric wall materials (the trench opening to be formed in a process 206). The fin 364 may further have a length 368 (i.e., a dimension measured along the y-axis of the example coordinate system shown) suitable to account for the length of the future nanoribbons (e.g., as described above with reference to the length of the nanoribbon 104). In various embodiments, any suitable patterning techniques may be used in the process 204 to form the fin 364, such as, but not limited to, photolithographic or electron-beam (e-beam) patterning, possibly in conjunction with a suitable etching technique, e.g., a dry etch, such as e.g., radio frequency (RF) reactive ion etch (RIE) or inductively coupled plasma (ICP) RIE. In some embodiments, the etch performed in the process 204 may include an anisotropic etch, using etchants in a form of e.g., chemically active ionized gas (i.e., plasma) using e.g., bromine (Br) and chloride (Cl) based chemistries. In some embodiments, during the etch of the process 204, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 3C:
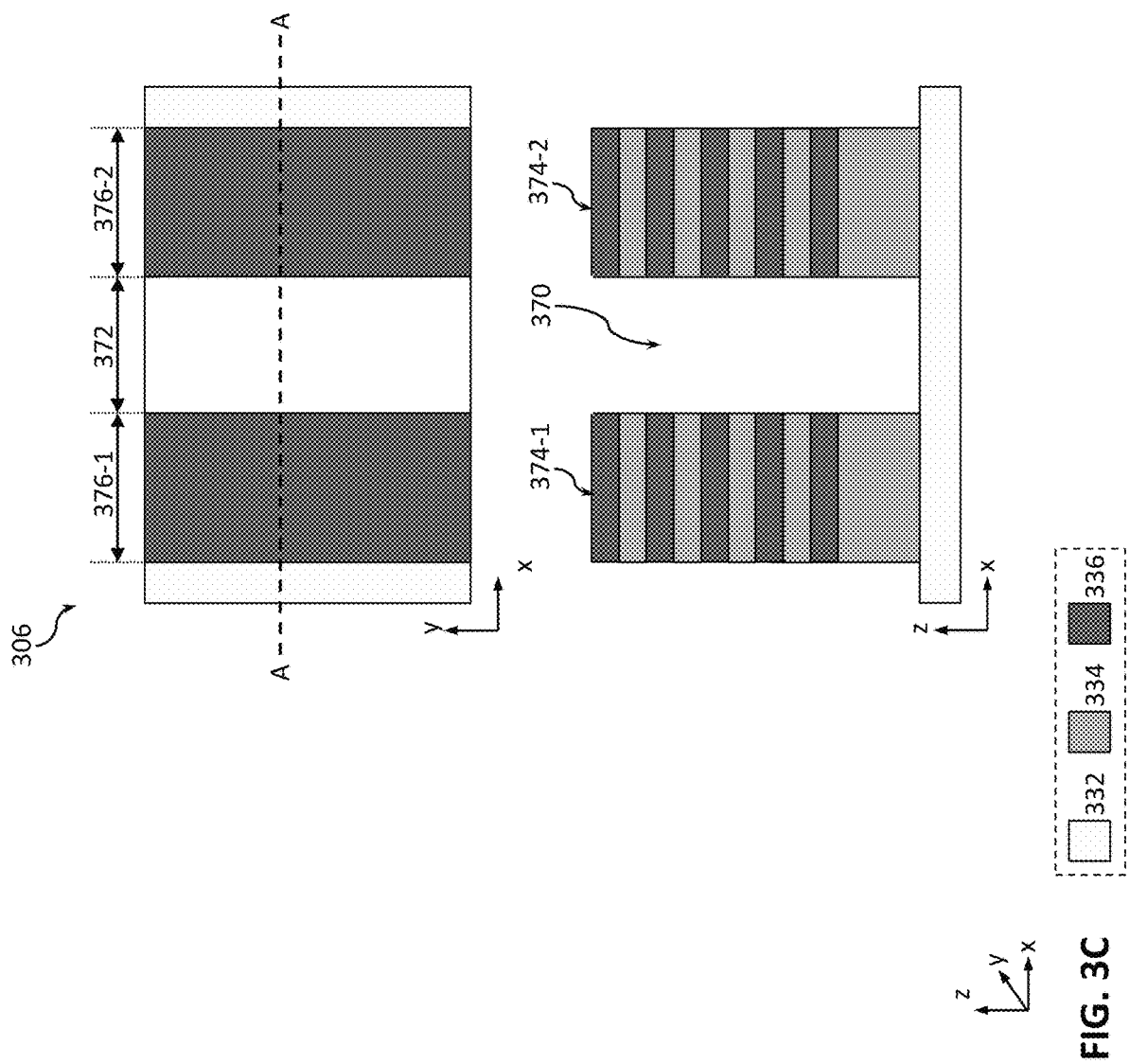

The method 200 may also include a process 206, in which a trench opening is formed substantially in the center of the fin formed in the process 204, the trench opening extending along the length of the fin. An IC structure 306 of FIG. 3C illustrates an example result of performing the process 206 on the IC structure 304. The IC structure 306 illustrates that a trench opening 370 is formed substantially in the center of the fin 364, the trench opening 370 extending along the length 368 of the fin 364. In various embodiments, any suitable patterning techniques may be used in the process 206 to form the trench opening 370, e.g., any of those described above with reference to forming the fin 364. The trench opening 370 may have a width 372, and may divide the fin 364 into a first stack portion 374-1 having a width 376-1 and a second stack portion 374-2 having a width 376-2. In some embodiments, the width 372 may be between about 10 and 25 nanometers, including all values and ranges therein. In some embodiments, the trench opening 370 may extend all the way to the support structure 332, as is shown in the IC structure 306. In other embodiments, the trench opening 370 may be such that it does not reach all the way down to the support structure 332.

Figure 3D:
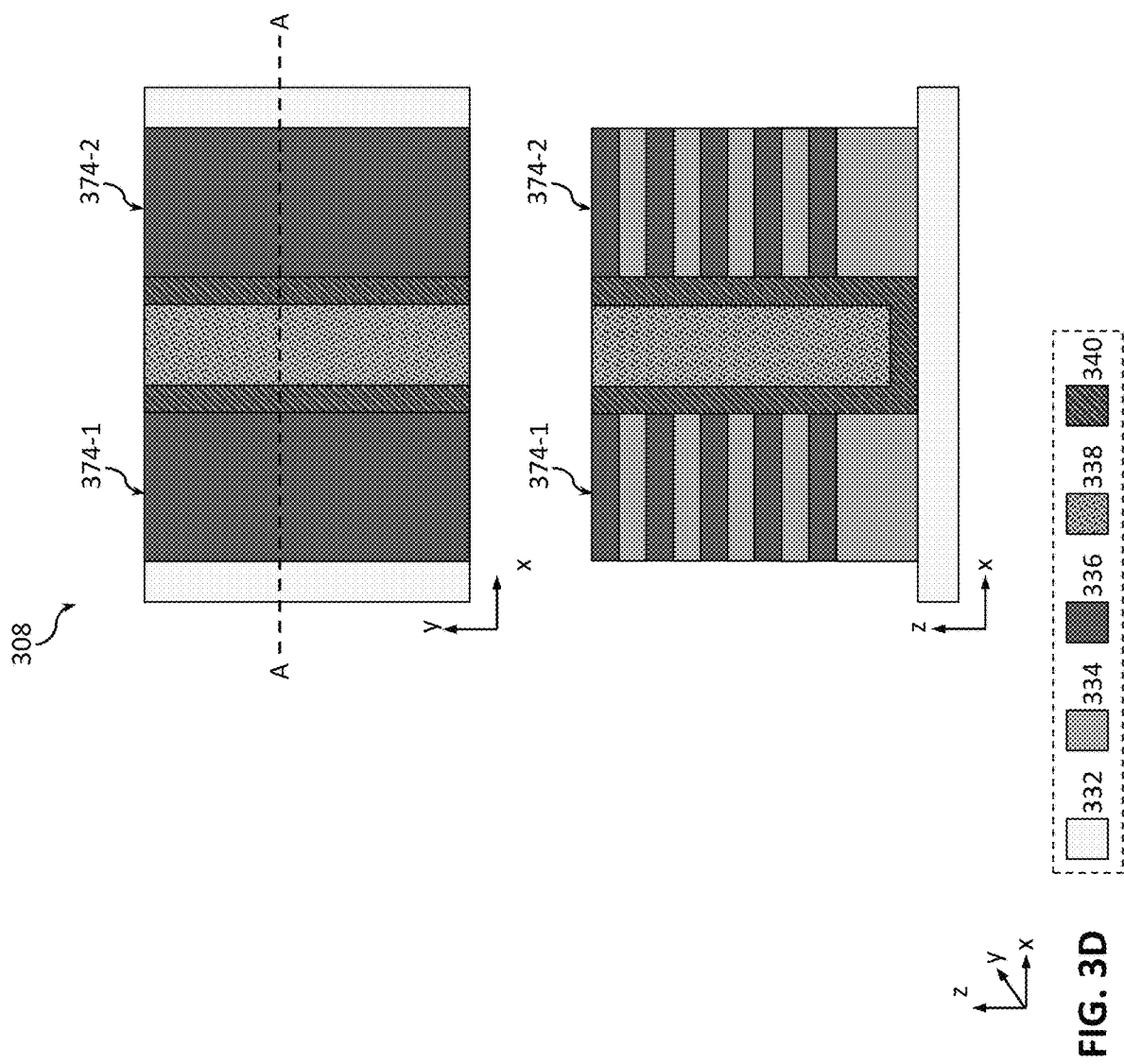

The method 200 may then proceed with a process 208 that includes depositing first and second dielectric wall materials into the trench opening formed in the process 206 so that the second dielectric wall material is between the first and second semiconductor materials of the stack and the first dielectric wall material. An IC structure 308 of FIG. 3D illustrates an example result of performing the process 208 on the IC structure 306. The IC structure 308 illustrates that the trench opening 370 is, first, lined with a layer of the second dielectric wall material 340, and then the remaining space in the trench opening 370 that has been lined with the second dielectric wall material 340 is filled with the first dielectric wall material 338. In some embodiments, the liner of the second dielectric wall material 340 may be provided on the sidewalls and the bottom of the opening 370 using any suitable techniques for conformally depositing dielectric materials onto selected surfaces, such as e.g. atomic layer deposition (ALD), chemical vapor deposition (CVD), plasma enhanced CVD (PECVD), or/and physical vapor deposition (PVD) processes such as e.g. sputter. The first dielectric wall material 338 may subsequently be deposited into the remaining spaces using any suitable technique such as ALD, CVD, spin-coating, or dip-coating. The first and second dielectric wall materials 338, 340 may include any suitable dielectric materials, e.g., any of the materials described above with references to low-k or high-k dielectric materials, as long as they are etch-selective with respect to one another.

Figure 3E:
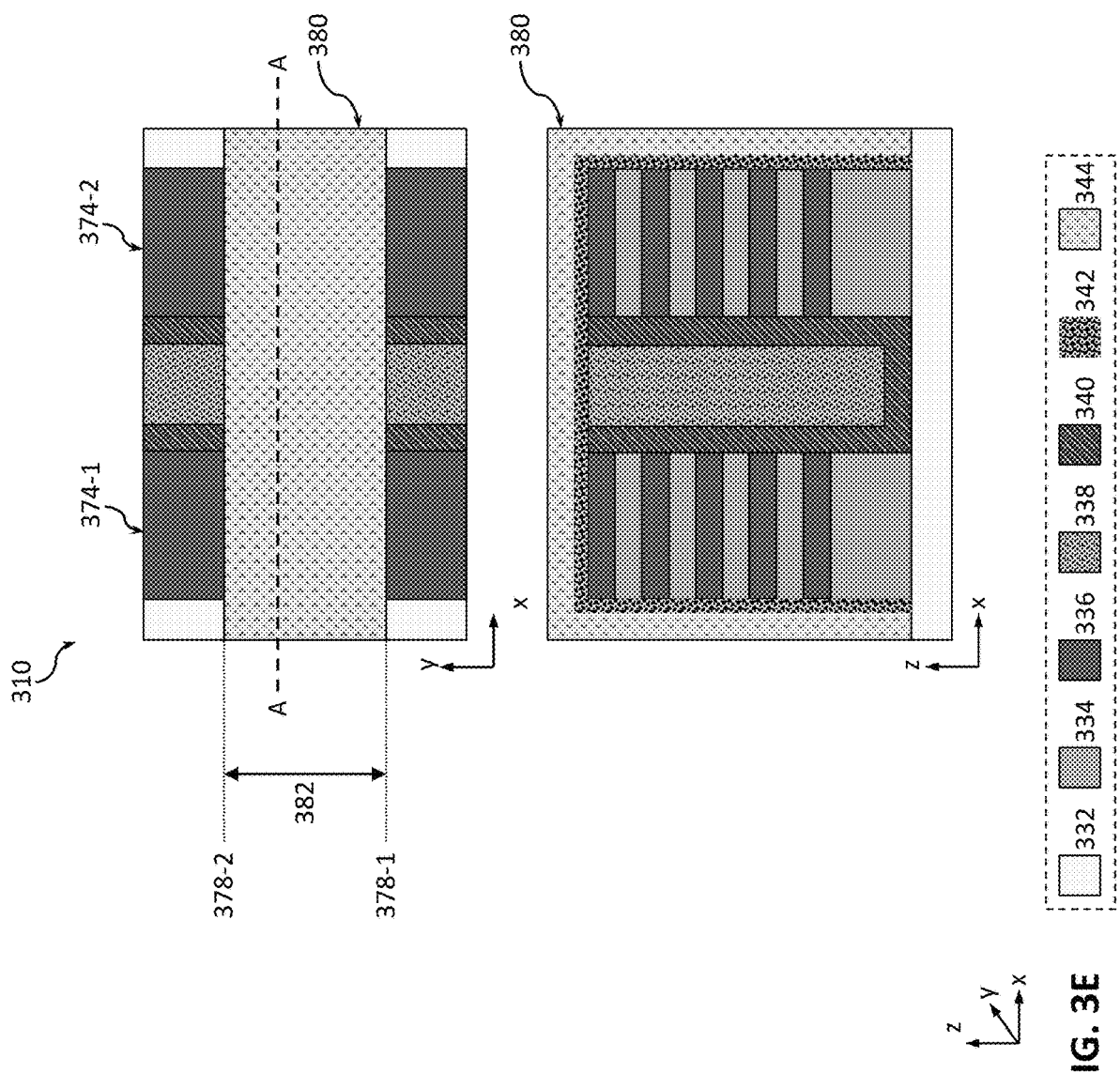

Next, the method 200 may include a process 210, in which a replacement gate material and, optionally, a replacement gate dielectric material, is provided over at least a portion of the IC structure 308 and patterned to form a replacement gate. An IC structure 310 of FIG. 3E illustrates an example result of performing the process 210 on the IC structure 308. The IC structure 310 illustrates a replacement gate dielectric material 342 provided over a portion of the fin 364 between a plane 378-1 and a plane 378-2, and a replacement gate material 344 being provided over the replacement gate dielectric material 342 to form a replacement gate 380. Each of the planes 378 may be a plane that is substantially perpendicular to the support structure 332 and substantially perpendicular to the length of the fin 364, i.e., a plane in the x-z plane of the example coordinate system shown. The planes 378-1 and 378-2 may be separated by a distance 382, corresponding to the channel length of the future transistors formed based on the first stack 374-1 and the second stack 374-2. Any of the techniques for providing replacement metal gates may be used in the process 210 to provide the replacement metal gate 380.

Figure 3F:
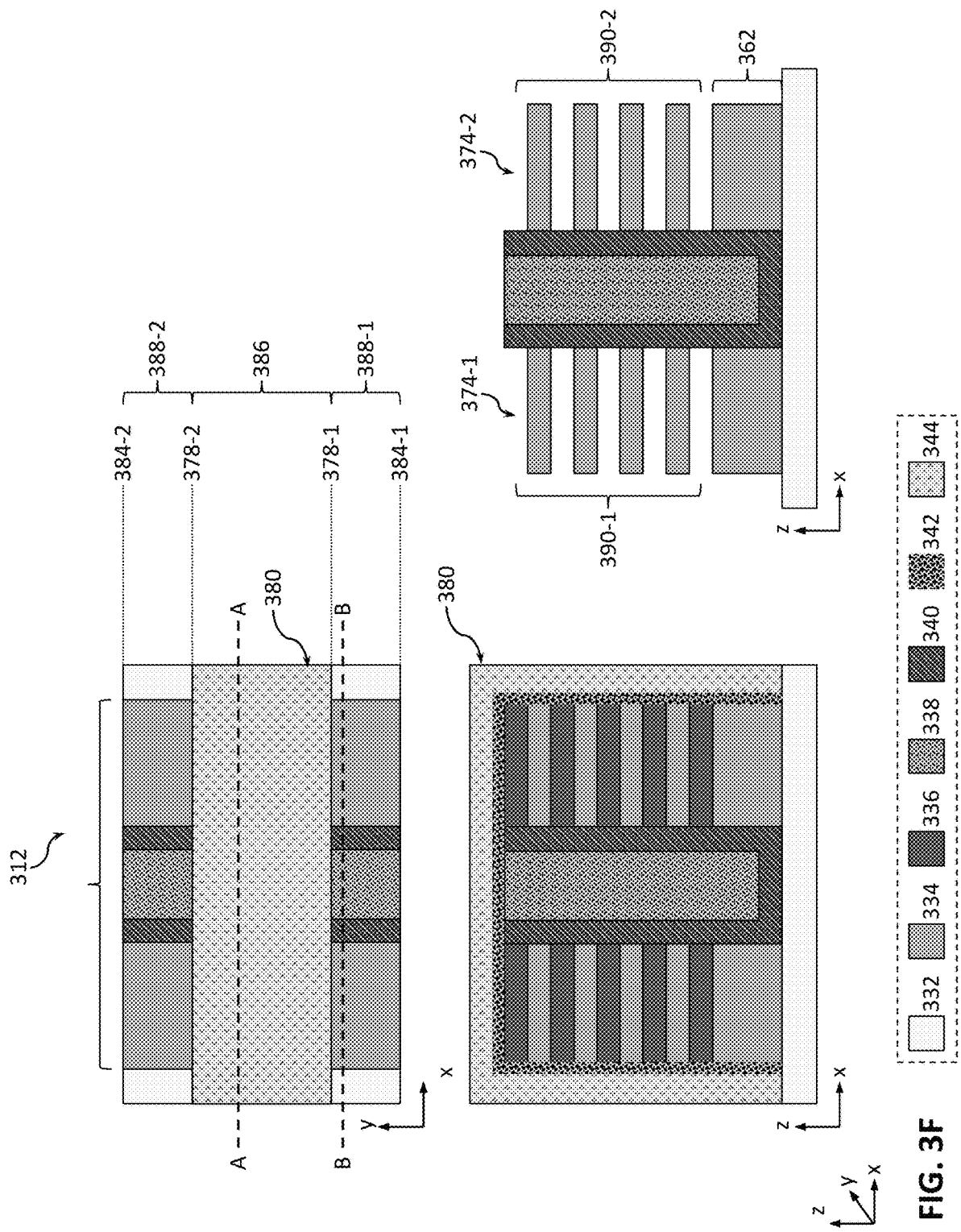

The method 200 may further include a process 212 that includes removing the second semiconductor material not covered by the replacement gate to form a first stack of nanoribbons of the first semiconductor material on one side of the trench opening and to form a second stack of nanoribbons of the first semiconductor material on another side of the trench opening. An IC structure 312 of FIG. 3F illustrates an example result of performing the process 212 on the IC structure 310. The cross-section BB of the IC structure 312 illustrates that the second semiconductor material 336 that was not covered by the replacement gate 380 (i.e., between the planes 378-1 and 384-1 and between the planes 378-2 and 384-2) has been removed, while the cross-section AA of the IC structure 312 illustrates that the second semiconductor material 336 that was covered by the replacement gate 380 (i.e., between the planes 378-1 and 378-2) remains. Because the first and second semiconductor materials 334, 336 are etch selective with respect to one another, removing the second semiconductor material 336 (e.g., SiGe) of the stack in the process 212 may include etching the second semiconductor material 336, e.g., using anisotropic etching, without substantially etching the first semiconductor material 334 (e.g., Si). The portion of the IC structure 312 between the planes 378-1 and 378-2 may be referred to as a gate portion 386, the portion of the IC structure 312 between the planes 378-1 and 384-1 may be referred to as a first S/D portion 388-1, and the portion of the IC structure 312 between the planes 378-1 and 384-1 may be referred to as a first S/D portion 388-2. Thus, the cross-section AA of the IC structure illustrates a cross-section across the gate portion 386, while the cross-section BB of the IC structure illustrates a cross-section across the first S/D portion 388-1 (a cross-section across the second S/D portion 388-2 would look substantially the same as the cross-section across the first S/D portion 388-1 and, therefore, is not specifically shown in the present drawings). Removing the second semiconductor material 336 not covered by the replacement gate 380 results in forming a first stack of nanoribbons 390-1 of the first semiconductor material 334 on one side of the trench opening 370 filled with the first and second dielectric wall materials 338, 340 (e.g., to the left of the trench opening 370, as shown in the cross-section BB of the IC structure 312), and forming a second stack of nanoribbons 390-2 of the first semiconductor material 334 on another side of the trench opening 370 filled with the first and second dielectric wall materials 338, 340 (e.g., to the right of the trench opening 370, as shown in the cross-section BB of the IC structure 312). Thus, the first stack of nanoribbons 390-1 are formed in the first stack portion 374-1 and the second stack of nanoribbons 390-2 is formed in the second stack portion 374-2 of the fin 364.

Figure 3G:
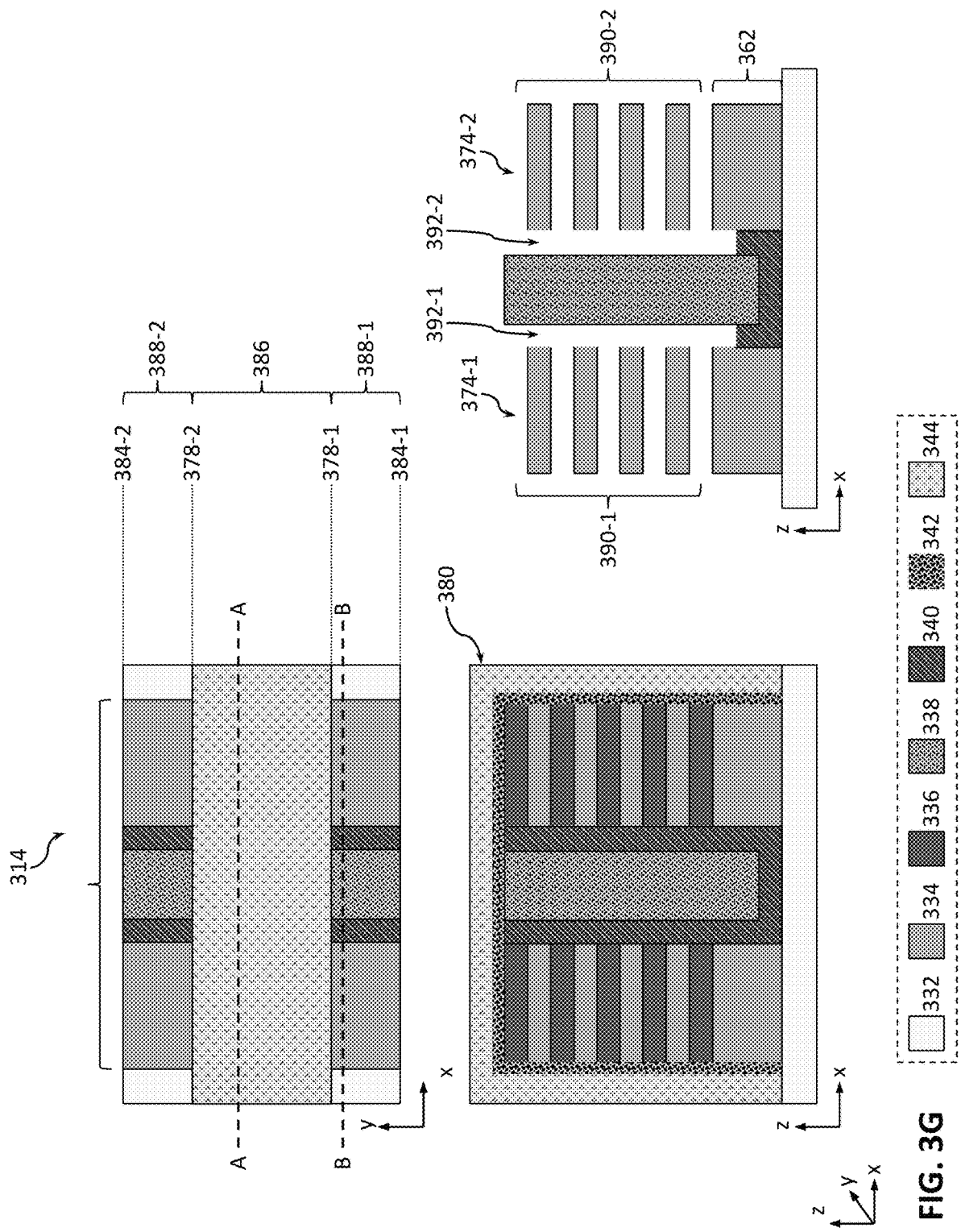

The method 200 may then continue with a process 214, that includes removing at least portions of the second dielectric wall material not covered by the replacement gate. An IC structure 314 of FIG. 3G illustrates an example result of performing the process 214 on the IC structure 312. The cross-section BB of the IC structure 314 illustrates how the second dielectric wall material 340 not covered by the replacement gate 380 (i.e., the second dielectric wall material 340 in the first and second S/D portions 388-1 and 388-2) is etched down, towards the support structure 332. Because the first and second dielectric wall materials 338, 340 are etch selective with respect to one another, removing the second dielectric wall material 340 not covered by the replacement gate 380 in the process 214 may include anisotropically etching the second dielectric wall material 340 without substantially etching the first dielectric wall material 338. As is shown in the cross-section BB of the IC structure 314, in some embodiments, the second dielectric wall material 340 may be removed in portions of the structure between the sidewalls of the nanoribbons 390-1 and 390-2 and the first dielectric wall material 338, forming openings 392-1 and 392-2, but the etch process may stop so that some of the second dielectric wall material 340 still remains at the bottom of the trench opening 370 (e.g., within the base 362) and some of the second dielectric wall material 340 may wrap around the lower portion of the first dielectric wall material 338.

Figure 3H:
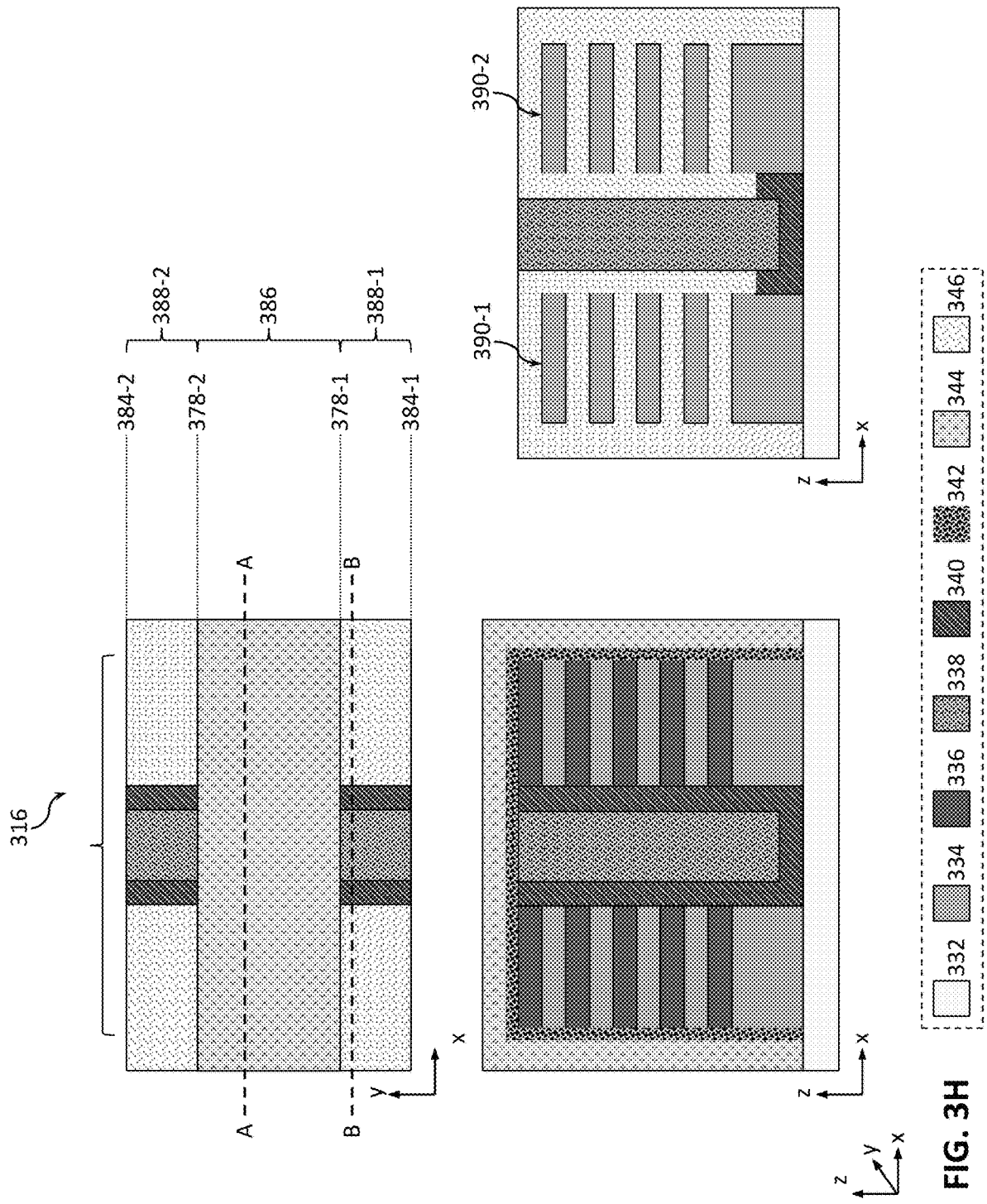
Figure 31:
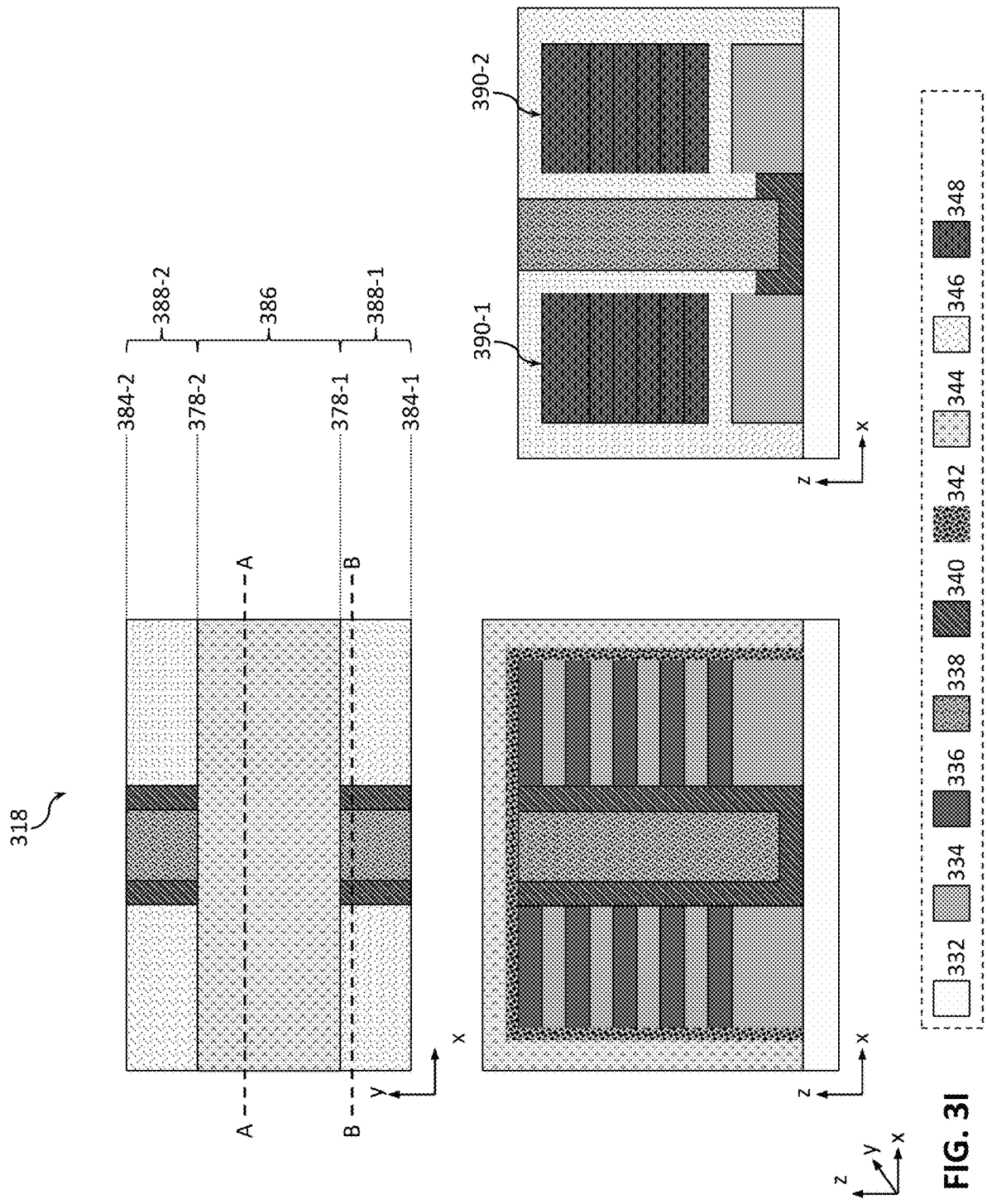

Next, the method 200 may include a process 216, in which a spacer material is deposited over at least a portion of the IC structure 314. An IC structure 316 of FIG. 3H illustrates an example result of performing the process 216 on the IC structure 314. The IC structure 316 illustrates a spacer material 346 provided in substantially all openings that were present in the IC structure 314. In particular, the spacer material 346 may be deposited into openings formed by removing the second semiconductor material 336 during the process 212 and into openings 392 formed by removing the second dielectric wall material 340 not covered by the replacement gate 380 in the process 214. The spacer material 346 may include any of the dielectric materials described above, e.g., any of the materials described above with references to low-k or high-k dielectric materials, and may be deposited using any suitable technique such as ALD, CVD, spin-coating, or dip-coating.

The method 200 may further include a process 218 that includes forming S/D regions in the first semiconductor material. An IC structure 318 of FIG. 3I illustrates an example result of performing the process 218 on the IC structure 316. The cross-section BB of the IC structure 318 illustrates that S/D regions 348 may be formed in the first and second S/D portions 388-1, 388-2 of the nanoribbons 390-1, 390-2 (i.e., in the portions not covered by the replacement gate 380). In some embodiments, the S/D regions 348 may be formed as described above with reference to the S/D regions 114 of the transistor 110 shown in FIG. 1, e.g., either using an implantation/diffusion process or an etching/deposition process. In some embodiments, the first semiconductor material 334 may include silicon and forming the S/D regions 348 in the S/D portions 388-1, 388-2 of the nanoribbons 390 of the first semiconductor material 334 may include implanting/diffusing germanium into these portions, to form SiGe S/D regions 348.

Figure 3J:
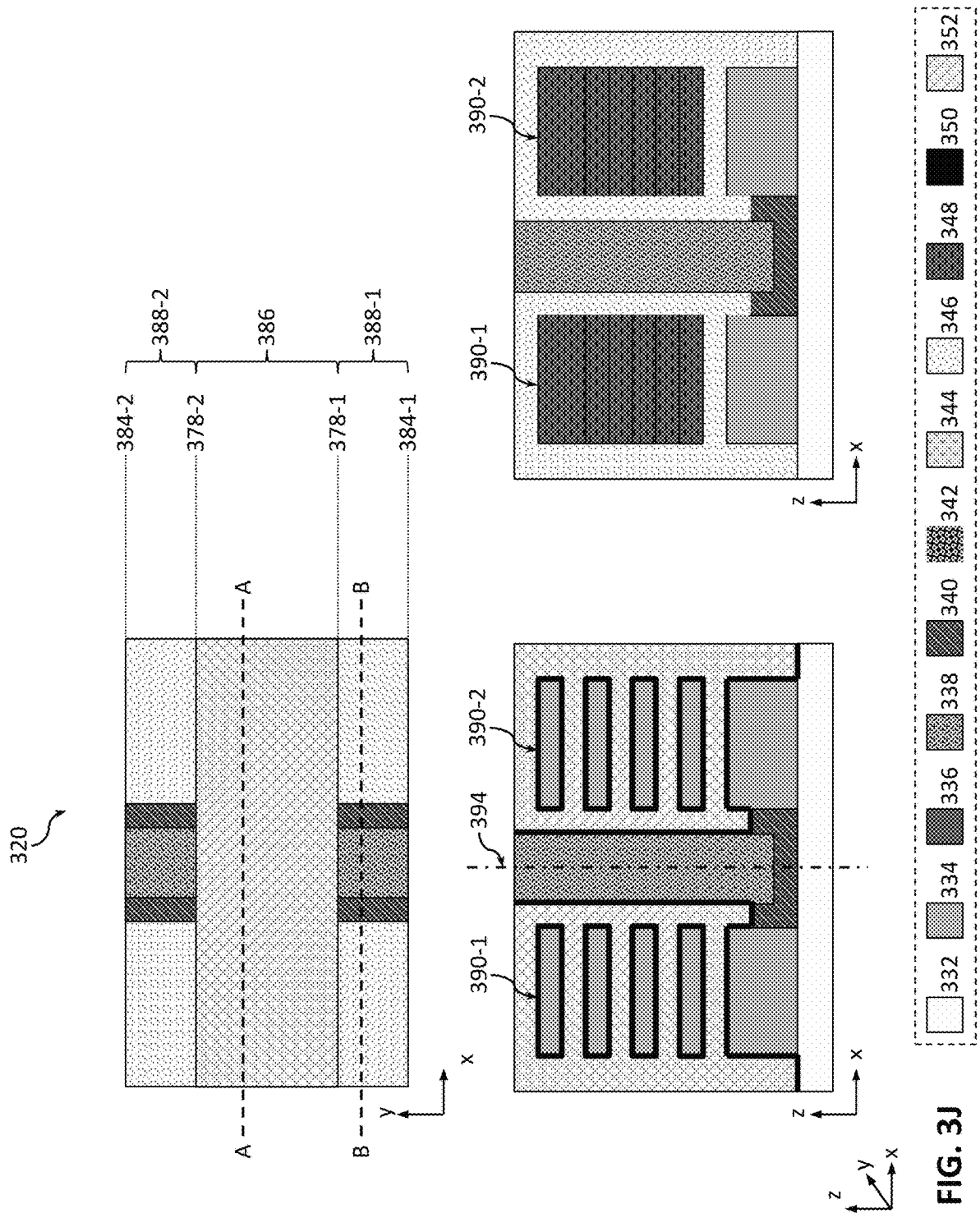

The method 200 may also include a process 220 that includes removing the replacement gate, the second semi-conductor material that was covered by the replacement gate, and the second dielectric wall material that was covered by the replacement gate, and providing a gate stack. An IC structure 320 of FIG. 3J illustrates an example result of performing the process 220 on the IC structure 318. Once the replacement gate 380 is removed, the second semiconductor material 336 that was previously covered by the replacement gate 380 may be removed, in a manner similar to that described above with reference to removing the second semiconductor material 336 in the process 212. The second dielectric wall material 340 that was previously covered by the replacement gate 380 may be removed in a manner similar to that described above with reference to removing the second dielectric wall material 340 in the process 214. As a result of removing the second semiconductor material 336 and the second dielectric wall material 340 that was previously covered by the replacement gate 380, openings around each of the nanoribbons 390 may be formed in the gate portion 386, which openings may later be filled with a gate stack. Providing a gate stack in the process 220 may include providing a gate dielectric material 350 and a gate electrode material 352 in the gate portion 386, e.g., as is shown in the cross-section AA of the IC structure 320. The gate dielectric material 350 may include any of the materials described with reference to the gate dielectric material 112, and the gate electrode material 352 may include any of the materials described with reference to the gate electrode material 108, described above. In some embodiments, providing the gate stack in the process 220 may include depositing a liner of the gate dielectric material 350 of the gate stack over exposed surfaces of the openings formed by removing the replacement gate 380 and the second dielectric wall material 340 that was previously covered by the replacement gate 380, and, after the liner of the gate dielectric material 350 has been deposited, depositing the gate electrode material 352 (e.g., a workfunction metal to set the N or P type gate workfunction) of the gate stack.

Further Examples of Nanocomb-Based Transistor Arrangements with Gate All Around

Figures 4A, 4B, 4C:
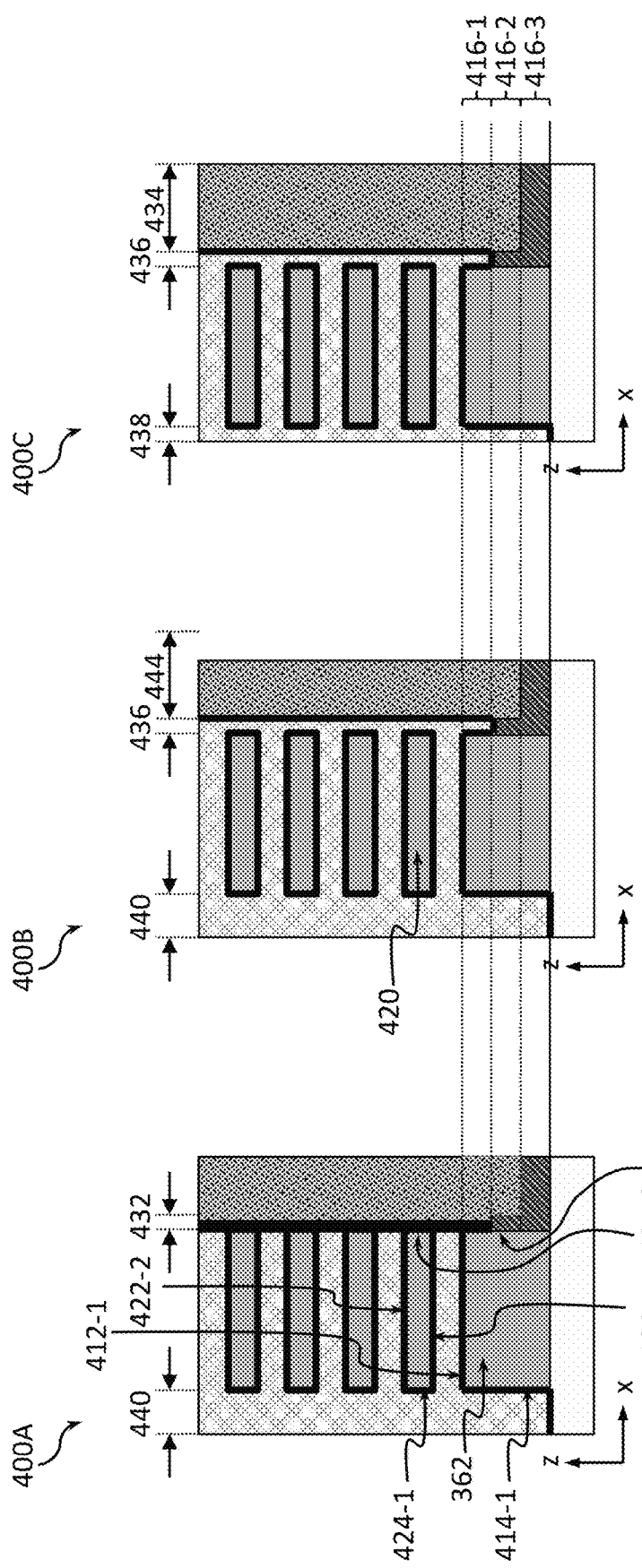
FIGS. 4A-4C provide different further examples of an example nanocomb-based transistor arrangement implementing gate all around, in accordance with some embodiments

FIGS. 3A-3J illustrate some example IC structures that may be fabricated to include a nanocomb-based transistor arrangement implementing gate all around as described herein. Some further examples, each of which could have been illustrated in illustrations of various stages of fabrication according to the method 200 similar to FIGS. 3A-3J, are shown in FIGS. 4A-4C, in accordance with some embodiments. Each of FIGS. 4A-4C provides an illustration of a cross-sectional side view of the cross-section AA as was shown in FIGS. 3A-3J, except that FIGS. 4A-4C only illustrate an example portion of the cross-section AA to the left of a line 394 shown in the cross-section AA in FIG. 3J. Thus, each of FIGS. 4A-4C provides an illustration of the cross-section in the gate portion 386 of the stack of the nanoribbons 390-1. The IC structures shown in FIGS. 4A-4C are similar to the IC structure 320, shown in FIG. 3J, and, therefore, descriptions provided with respect to the IC structure 320 are applicable to the IC structures shown in FIGS. 4A-4C and, in the interests of brevity, are not repeated here. Instead, only the differences between the IC structures shown in FIGS. 4A-4C and the IC structure 320 are described.

The IC structures shown in FIGS. 4A-4C have several elements in common with one another. In order to not clutter the drawings by individually labeling every common element on each of FIGS. 4A-4C, some of the common elements are shown in only some of FIGS. 4A-4C, but not the others. For example, a nanoribbon 420 is labeled only in FIG. 4B, while faces 422 and sidewalls 424 of the nanoribbon 420 are labeled only in FIG. 4A. In the following, first, elements common to all of the IC structures shown in FIGS. 4A-4C are described, followed by the description of the differences between the illustrations of the IC structures shown in FIGS. 4A-4C.

FIGS. 4A-4C illustrate various embodiments of an IC structure 400 (shown as an IC structure 400A in FIG. 4A, an IC structure 400B in FIG. 4B, and an IC structure 400C in FIG. 4C) which includes the base 362, as was shown in the IC structure 320, except that in FIGS. 4A-4C labels are provided for various surfaces of the base 362. In particular, FIGS. 4A-4C illustrate a first face 412-1 of the base 362 (i.e., a face opposite the support structure 332 and farthest away from the support structure 332), a first sidewall 414-1 of the base 362, and a second sidewall 414-2 of the base 362, each of the first and second sidewalls 414-1, 414-2 being substantially perpendicular to the support structure 332 and opposite one another. In the IC structure 400, similar to the IC structure 320, a nanoribbon arrangement is provided, or stacked, over the base 362, e.g., the four nanoribbons 390-1 for the example shown in the present drawings. One example nanoribbon of the stack of the nanoribbons 390-1 is labeled in FIGS. 4A-4C as a nanoribbon 420. The nanoribbon 420 is formed of the first semiconductor material 334 and includes a first face 422-1, opposite (e.g., parallel to) the support structure 332, a second face 422-2, opposite the first face 422-1, a first sidewall 424-1, substantially perpendicular to the support structure 332, and a second sidewall 424-2, opposite the first sidewall 424-1. As was described above, like all of the nanoribbons 390, the nanoribbon 420 extends in a direction substantially parallel to the support structure 390, i.e., the nanoribbon 420 has a long axis substantially parallel to the support structure 332. For all of FIGS. 4A-4C, the first dielectric wall material 338 is provided, shaped as a wall substantially perpendicular to the support structure 332 and extending along the second sidewall 424-2 of the nanoribbon 420. Also applicable to all of FIGS. 4A-4C, a gate stack is provided over at least a portion of the nanoribbon 420. The gate stack including the gate dielectric material 348, shown in FIG. 4) wrapping around a portion of the nanoribbon between a first plane (e.g., plane 362-1, shown in FIG. 3J) and a second plane (e.g., plane 362-2, shown in FIG. 3J), where each of the first plane and the second plane is substantially perpendicular to each of the support structure and a long axis of the nanoribbon, the second plane being at a distance 364 from the first plane. The gate stack further includes the gate electrode material 350 wrapping around at least the portion of the gate dielectric material 348 that is provided over the first face 422-1, the second face 422-2, and the first sidewall 424-1 of the nanoribbon 420.

One difference between some of the embodiments shown in FIGS. 4A-4C is in the arrangement of the gate stack along the second sidewall 424-2 of the nanoribbon 420, and, consequently, in the arrangement of the gate stack between the second sidewall 414-2 of the base 362 and the first dielectric wall material 338. In particular, FIG. 4A illustrates an example embodiment where only the gate dielectric material 348 is provided along the second sidewalls 424-2 of the nanoribbons 390 (e.g., of the nanoribbon 420), i.e., there is no gate electrode material 350 between the second sidewalls 424-2 of the nanoribbons 390 and the first dielectric wall material 338. In other words, for the embodiment of FIG. 4A, the gate dielectric material 348 provided over the second sidewall 424-2 of the nanoribbon 420 may be between, and in contact with, each of the first semiconductor material 334 of the nanoribbon 420 on one side and the first dielectric wall material 338 on the other side. On the other hand, each of FIGS. 4B and 4C illustrates an example embodiment where, in addition to the gate dielectric material 348, the gate electrode material 350 is provided along the second sidewalls 424-2 of the nanoribbons 390 (e.g., of the nanoribbon 420). Because the gate dielectric material 348 may be deposited as a conformal liner on all exposed surfaces during the process 220, and the gate electrode material 350 may be deposited subsequently to fill in the remaining openings in the gate portion 386, the embodiments of FIGS. 4B and 4C (as well as the embodiment of FIG. 3J) illustrate that there may be a first liner of the gate dielectric material 348 between the second sidewalls 424-2 of the nanoribbons 390 and the gate electrode material 350 provided on the side of the second sidewalls 424-2, and there may be a second liner of the gate dielectric material 348 between the gate electrode material 350 provided on the side of the second sidewalls 424-2 and the first dielectric wall material 338 (i.e., the second liner of the gate dielectric material 348 may be on the sidewall of the first dielectric wall material 338).

The differences in the gate stack between the second sidewall 424-2 of the nanoribbon 420 and the first dielectric wall material 338, shown in FIGS. 4A-4C, correspond in the differences in the gate stack between different portions of the second sidewall 414-2 of the base 362 and the first dielectric wall material 338. In particular, FIGS. 4A-4C illustrate that the IC structure 400, e.g., the base 362 (in particular, the second sidewall 414-2 of the base 362), may be seen as including 3 portions 416, labeled in FIGS. 4A-4C as portions 416-1, 416-2, and 416-2, between the planes substantially parallel to the support structure 332 and illustrated in FIGS. 4A-4C as dotted lines between the portions 416. The first portion 416-1 may be the portion that is the farthest away from the support structure 332, and the third portion 416-3 may be the portion that is the closest to the support structure 332, with the second portion 416-2 being between the first portion 416-1 and the third portion 416-3, as shown in FIGS. 4A-4C.

The first portion 416-1 may be the portion where the second dielectric wall material 340 has been recessed in the process 214, so that, in the first portion 416-1, there is no second dielectric wall material 340 between the second sidewall 414-2 of the base 362 and the first dielectric wall material 338. For the embodiments of FIG. 4A, in the first portion 416-1, there is no gate electrode material 350 between the second sidewall 414-2 of the base 362 and the first dielectric wall material 338. For some example embodiments of FIG. 4A, in the first portion 416-1, the gate dielectric material 348 may have a first side that is in contact with the second sidewall 414, and may have a second side that is in contact with the first dielectric wall material 338. For the embodiments of FIGS. 4B and 4C, because the gate dielectric material 348 may be deposited as a conformal liner on all exposed surfaces during the process 220, and the gate electrode material 350 may be deposited subsequently to fill in the remaining openings in the gate portion 386, the embodiments of FIGS. 4B and 4C (as well as the embodiment of FIG. 3J) illustrate that there may be a first liner of the gate dielectric material 348 between the second sidewalls 414-2 of the base 362 and the gate electrode material 350 provided on the side of the second sidewall 414-2, and there may be a second liner of the gate dielectric material 348 between the gate electrode material 350 provided on the side of the second sidewall 414-2 and the first dielectric wall material 338 (i.e., in the portion 416-1, the second liner of the gate dielectric material 348 may be on the sidewall of the first dielectric wall material 338).

The second portion 416-2 may be the portion where the etch of the second dielectric wall material 340 of the process 214 stopped, so that, in the second portion 416-1, the second dielectric wall material 340 is still present between the second sidewall 414-2 of the base 362 and the first dielectric wall material 338. For all of the embodiments of FIGS. 4A-4C (and the embodiment of FIG. 3J), no portion of the gate dielectric material 348 or of the gate electrode material 350 is provided in the second portion 416-2 between the second sidewall 414-2 of the base 362 and the first dielectric wall material 338. This is indicative of the use of the method 200 where the replacement gate 380 was used and only the second dielectric wall material 340 that was not covered by the replacement gate 380 was etched in the process 214.

The third portion 416-3 may be the portion where the second dielectric wall material 340 was provided at the bottom of the trench opening 370 in the process 208, so that, in the third portion 416-3, there is no first dielectric wall material 338 to the right of the second sidewall 414-2 of the base 362 and the second dielectric wall material 340 is present instead.

FIGS. 4A-4C illustrate that the width of the trench opening 370 formed in the process 206 and/or the thickness of the layer of the second dielectric wall material 340 deposited in the process 208 may be varied to realize different embodiments, each of which may have different advantageous in certain deployment scenarios. For example, the embodiment of FIG. 4A illustrates a scenario where the layer of the second dielectric wall material 340 deposited in the process 208 is just thick enough (with a thickness 432, labeled in FIG. 4A) to get the gate dielectric material 348 between the sidewalls 424-2 of the nanoribbons 390 and the first dielectric wall material 338, thus improving short-channel effects while not suffering much in terms of capacitance penalty. On the other hand, the embodiment of FIG. 4C illustrates a scenario where the width/thickness (a dimension measured along the x-axis of the example coordinate system shown in the present drawings) of the first dielectric wall material 338 (a thickness 434, labeled in FIG. 4C) is kept substantially the same as in conventional nanocomb transistor arrangements, while adding the second dielectric wall material 340 with a thickness 436, labeled in FIG. 4C, to it. In such an embodiment, in order to keep the overall width of the IC structure the same, this means that the endcap on the sidewalls 424-1 of the nanoribbons 390 (i.e., the amount of the gate electrode material 350 on the sidewalls farthest away from the first dielectric wall material 338) is reduced, the width of the endcap labeled in FIG. 4C as a width 438 (a dimension measured along the x-axis of the example coordinate system shown in the present drawings). This may advantageously result in a lower capacitance penalty, but might be more challenging to process because of the reduced width 438 of the endcap. Finally, the embodiment of FIG. 4B illustrates a scenario where the width of the endcap may be kept substantially as that in conventional nanocomb transistor arrangements, labeled in FIG. 4B as a width 440 (the same width is labeled in FIG. 4A), while introducing the second dielectric wall material 340 of the thickness 436 at the cost of the reduced width 444 of the first dielectric wall material 338 (i.e., the width 444 is smaller than the width 434). This may advantageously ease patterning while still providing an improvement in terms of short-channel effects, but may have an increased capacitance, compared to the embodiment of FIG. 4C.

Example Devices

The IC structures with nanocomb-based transistor arrangements implementing gate all around, disclosed herein, may be included in any suitable electronic device. FIGS. 5-8 illustrate various examples of apparatuses that may include one or more of the IC structures disclosed herein.

Figure 5B:
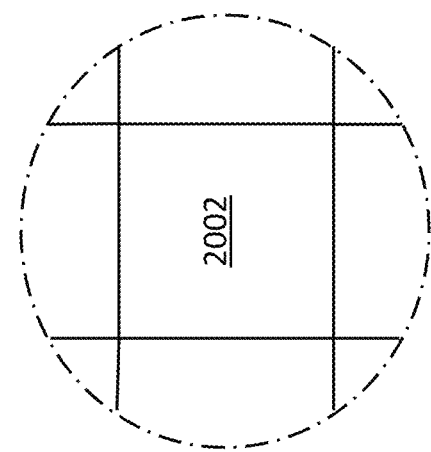
FIGS. 5A and 5B are top views of, respectively, a wafer and dies that may include one or more nanocomb-based transistor arrangements implementing gate all around, in accordance with various embodiments.
Figure 5A:
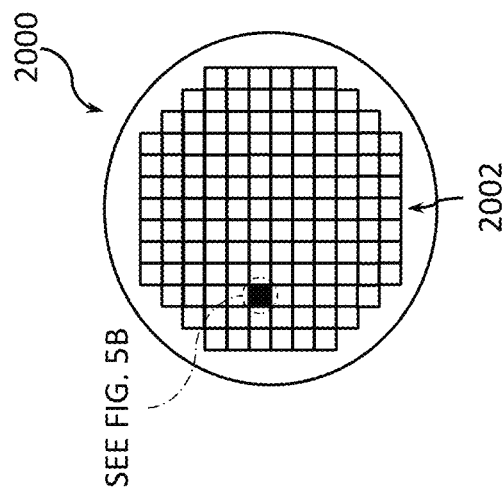

FIGS. 5A-5B are top views of a wafer 2000 and dies 2002 that may include one or more nanocomb-based transistor arrangements implementing gate all around in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more nanocomb-based transistor arrangements implementing gate all around as described herein). After the fabrication of the semiconductor product is complete (e.g., after manufacture of one or more layers of the nanocomb-based transistor arrangements implementing gate all around as described herein), the wafer 2000 may undergo a singulation process in which each of the dies 2002 is separated from one another to provide discrete "chips" of the semiconductor product. In particular, devices that include one or more nanocomb-based transistor arrangements implementing gate all around as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 8) or other logic that is configured to store information in the memory devices or execute instructions stored in the memory array.

Figure 6:
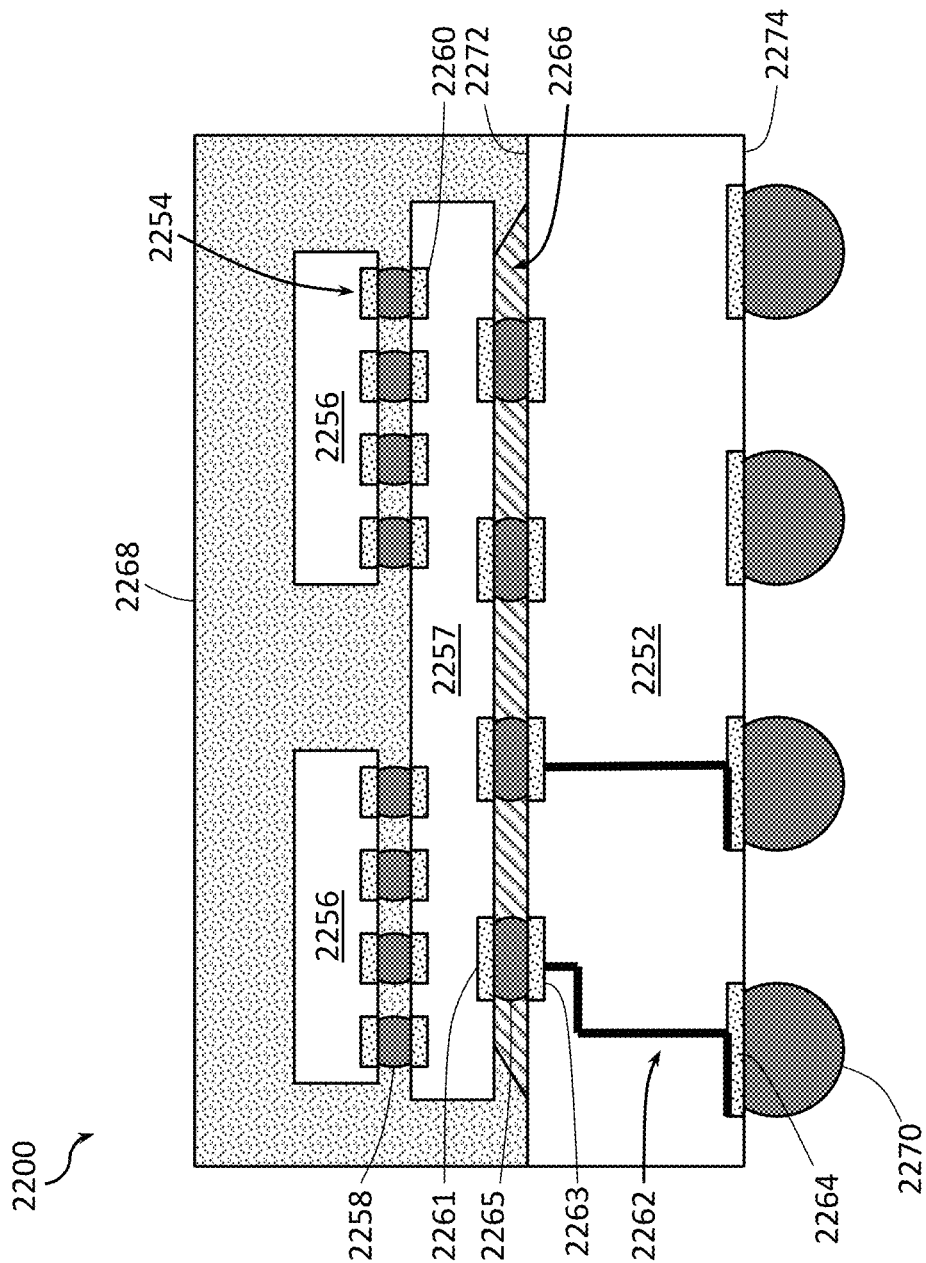
FIG. 6 is a cross-sectional side view of an integrated circuit (IC) package that may include one or more nanocomb-based transistor arrangements implementing gate all around, in accordance with various embodiments.

FIG. 6 is a side, cross-sectional view of an example IC package 2200 that may include one or more nanocomb-based transistor arrangements implementing gate all around in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein (e.g., may include any of the embodiments of the nanocomb-based transistor arrangements implementing gate all around as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more nanocomb-based transistor arrangements implementing gate all around as discussed above; in some embodiments, at least some of the dies 2256 may not include any nanocomb-based transistor arrangements implementing gate all around.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
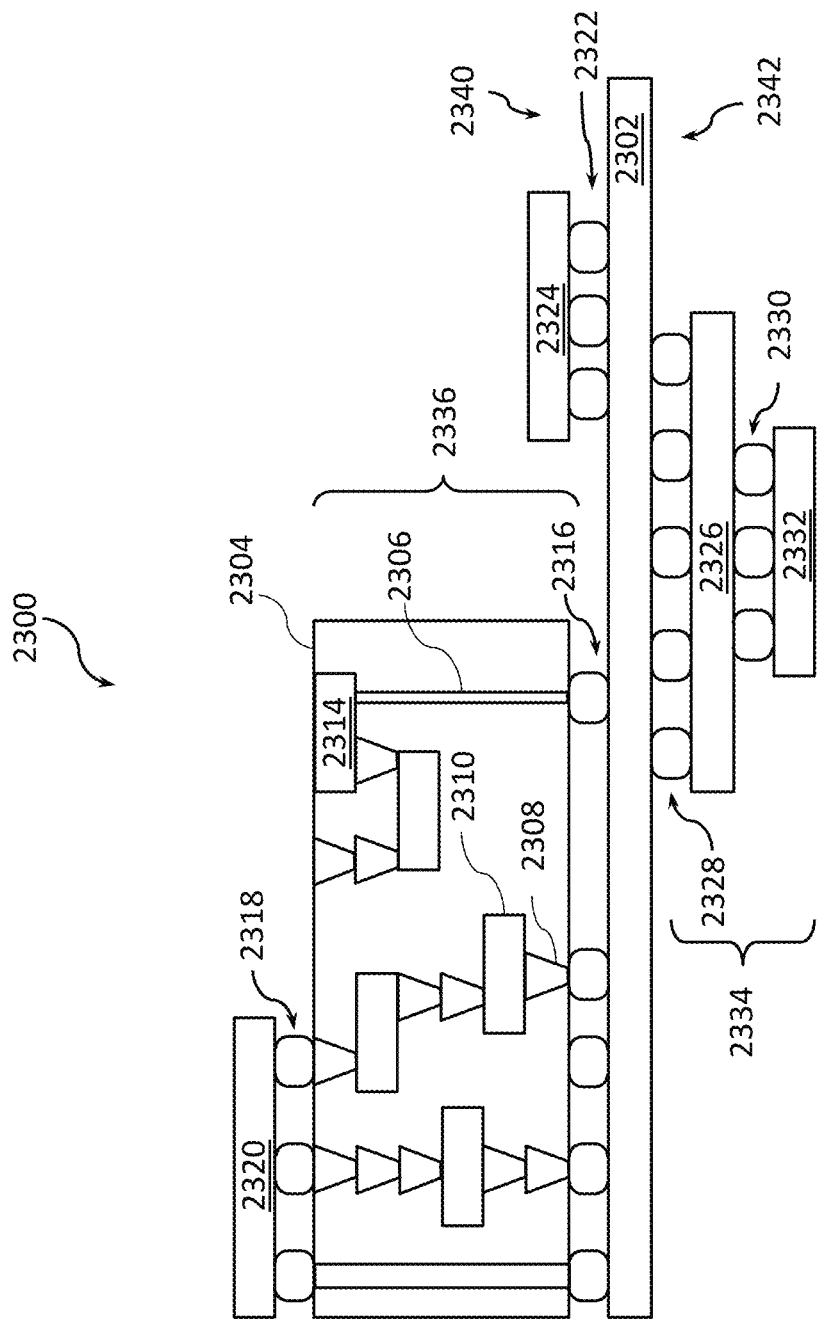
FIG. 7 is a cross-sectional side view of an IC device assembly that may include one or more nanocomb-based transistor arrangements implementing gate all around, in accordance with various embodiments.

FIG. 7 is a cross-sectional side view of an IC device assembly 2300 that may include components having one or more nanocomb-based transistor arrangements implementing gate all around in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more nanocomb-based transistor arrangements implementing gate all around in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more nanocomb-based transistor arrangements implementing gate all around provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device, or any other suitable component. In particular, the IC package 2320 may include one or more nanocomb-based transistor arrangements implementing gate all around as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
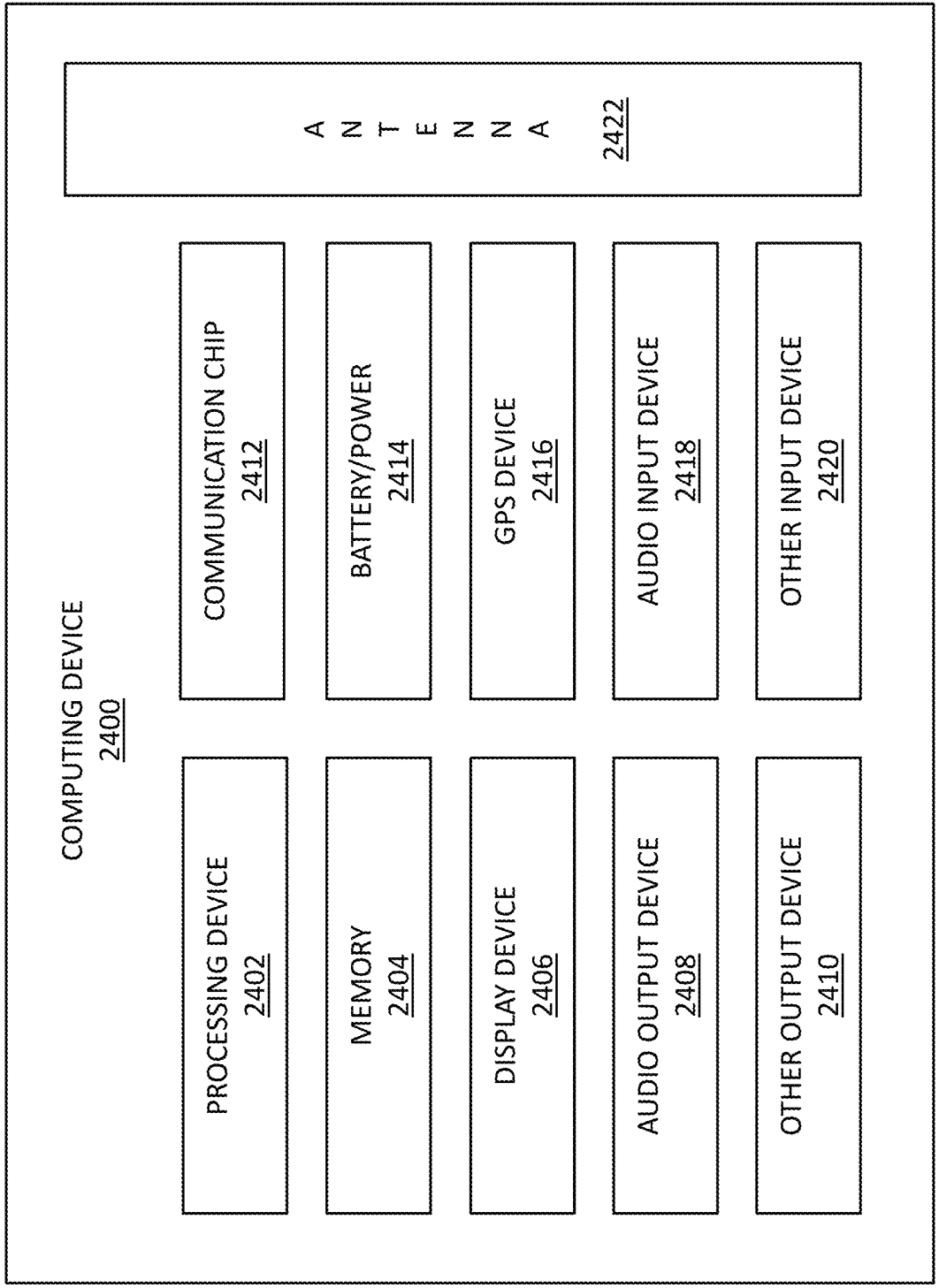
FIG. 8 is a block diagram of an example computing device that may include one or more nanocomb-based transistor arrangements implementing gate all around, in accordance with various embodiments.

FIG. 8 is a block diagram of an example computing device 2400 that may include one or more components with one or more nanocomb-based transistor arrangements implementing gate all around in accordance with any of the embodiments disclosed herein. For example, any suitable ones of the components of the computing device 2400 may include a die (e.g., the die 2002, shown in FIG. 5B) including one or more nanocomb-based transistor arrangements implementing gate all around in accordance with any of the embodiments disclosed herein. Any of the components of the computing device 2400 may include an IC package 2200 (e.g., as shown in FIG. 6). Any of the components of the computing device 2400 may include an IC device assembly 2300 (e.g., as shown in FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a method of fabricating a transistor arrangement. The method includes providing a stack of first and second semiconductor materials (e.g., Si and SiGe, respectively) over a base of the first semiconductor material; patterning the stack and the base to form a fin having a width and a length suitable for nanoribbons; forming a trench opening substantially in a center of the fin, the trench opening extending along the length of the fin; depositing first and second dielectric wall materials into the trench opening so that the second dielectric wall material is between the first and second semiconductor materials of the stack and the first dielectric wall material; providing a replacement gate material and pattern the replacement gate material to form a replacement gate; removing the second semiconductor material not covered by the replacement gate to form a first stack of nanoribbons of the first semiconductor material on one side of the trench opening and to form a second stack of nanoribbons of the first semiconductor material on another side of the trench opening; removing the second dielectric wall material not covered by the replacement gate; depositing a spacer material; forming S/D regions in the first semiconductor material; and removing the replacement gate, the second semiconductor material that was covered by the replacement gate, and the second dielectric wall material that was covered by the replacement gate and provide a gate stack.

Example 2 provides the method according to example 1, where depositing the first and second dielectric wall materials into the trench opening includes: performing a conformal deposition of the second dielectric wall material to provide a liner of the second dielectric wall material on sidewalls and bottom of the trench opening, and depositing the first dielectric wall material into the trench opening provided with the liner.

Example 3 provides the method according to examples 1 or 2, where forming the replacement gate further includes providing and patterning a replacement gate dielectric material.

Example 4 provides the method according to any one of the preceding examples, where the first and second semiconductor materials are etch selective with respect to one another, and where removing the second semiconductor material (e.g., SiGe) of the stack in the process 212 includes etching the second semiconductor material without substantially etching the first semiconductor material (e.g., Si).

Example 5 provides the method according to any one of the preceding examples, where depositing the spacer material includes depositing the spacer material into openings formed by removing the second semiconductor material of the stack in the process 212 and into opening formed by removing the second dielectric wall material not covered by the replacement gate in the process 214.

Example 6 provides the method according to any one of the preceding examples, where the first and second dielectric wall materials are etch selective with respect to one another, and where removing the second dielectric wall material not covered by the replacement gate in the process 214 includes anisotropically etching the second dielectric wall material not covered by the replacement gate without substantially etching the first dielectric wall material.

Example 7 provides the method according to any one of the preceding examples, where removing the replacement gate and the second dielectric wall material that was covered by the replacement gate includes forming, in a gate portion, openings around each of the nanoribbons of the first stack and the second stack of nanoribbons.

Example 8 provides the method according to example 7, where providing the gate stack includes depositing a liner of a gate dielectric material of the gate stack over exposed surfaces of the openings formed by removing the replacement gate and the second dielectric wall material that was covered by the replacement gate, and after the liner of the gate dielectric material has been deposited, depositing a gate electrode material (e.g., a workfunction metal to set the N or P type gate workfunction) of the gate stack.

Example 9 provides the method according to examples 7 or 8, where the gate portion is a portion around a portion of the nanoribbons of the first stack and the second stack between a first plane (e.g., plane 378-1 shown in FIG. 3J) and a second plane (e.g., plane 378-2 shown in FIG. 3J), where each of the first plane and the second plane is substantially perpendicular to each of the support structure and the length of the fin, the second plane being at a distance 382 from the first plane.

Example 10 provides the method according to any one of the preceding examples, where the trench opening formed substantially in the center of the fin extends to the support structure.

Example 11 provides a transistor arrangement that includes a support structure (e.g., a support structure 332, shown in FIG. 4, e.g., a substrate, a chip, or a wafer); a base (e.g., a base 362, shown in FIG. 4) extending away from the support structure, the base having a first face (e.g., a face 412-1, shown in FIG. 4) that is a face opposite (i.e., parallel to) the support structure and farthest away from the support structure, a first sidewall (e.g., a sidewall 414-1, shown in FIG. 4) substantially perpendicular to the support structure, and a second sidewall (e.g., a sidewall 414-2, shown in FIG. 4) opposite the first sidewall; and a nanoribbon arrangement provided/stacked over the base. The nanoribbon arrangement includes a nanoribbon (e.g., a nanoribbon 420, shown in FIG. 4) formed of a first semiconductor material and having a long axis parallel to the support structure, where the base is between the support structure and the nanoribbon, and a gate dielectric material (e.g., a gate dielectric material 348, shown in FIG. 4, which material may include a plurality of gate dielectric materials) wrapping around a portion of the nanoribbon between a first plane (e.g., plane 378-1, shown in FIG. 3J) and a second plane (e.g., plane 378-2, shown in FIG. 3J), where each of the first plane and the second plane is substantially perpendicular to each of the support structure and the long axis of the nanoribbon, the second plane being at a distance 382 from the first plane. The transistor arrangement further includes a trench opening partially filled with a first dielectric wall material (e.g., a dielectric wall material 338, shown in FIG. 4) and partially filled with a second dielectric wall material (e.g., a dielectric wall material 340, shown in FIG. 4), the trench opening extending along the long axis of the nanoribbon. The second sidewall of the base has a first portion (e.g., a portion 416-1, shown in FIG. 4) and a second portion (e.g., a portion 416-2, shown in FIG. 4), the second portion being between the support structure and the first portion (i.e., the first portion of the second sidewall of the base being further away from the support structure than the second portion). The transistor arrangement further includes the gate dielectric material between the first portion of the second sidewall of the base and the first dielectric wall material. A portion of the second dielectric wall material is between the second portion of the second sidewall of the base and the first dielectric wall material. The second dielectric wall material is a material that is etch selective with respect to the first dielectric wall material.

Example 12 provides the transistor arrangement according to example 11, where no portion of the second dielectric wall material is provided between the first portion of the second sidewall of the base and the first dielectric wall material.

Example 13 provides the transistor arrangement according to examples 11 or 12, where a portion of the trench opening between a plane parallel to the support structure and aligned with a top of the first portion of the second sidewall of the base and a plane parallel to the support structure and aligned with a bottom of the first portion of the second sidewall of the base further includes a gate electrode material, and the gate dielectric material that is between the first portion of the second sidewall of the base and the first dielectric wall material is between the first portion of the second sidewall of the base and the gate electrode material.

Example 14 provides the transistor arrangement according to example 13, where the transistor arrangement further includes the gate dielectric material between the gate electrode material and the first dielectric wall material.

Example 15 provides the transistor arrangement according to examples 11 or 12, where the gate dielectric material that is between the first portion of the second sidewall of the base and the first dielectric wall material has a first side that is in contact with the first portion of the second sidewall of the base and has a second side that is in contact with the first dielectric wall material.

Example 16 provides the transistor arrangement according to example 15, where no portion of the trench opening between a plane parallel to the support structure and aligned with a top of the first portion of the second sidewall of the base and a plane parallel to the support structure and aligned with a bottom of the first portion of the second sidewall of the base includes a gate electrode material.

Example 17 provides the transistor arrangement according to any one of examples 11-16, where no portion of the gate dielectric material is provided between the second portion of the second sidewall of the base and the first dielectric wall material.

Example 18 provides the transistor arrangement according to any one of examples 11-17, where the second sidewall of the base further has a third portion (e.g., a portion 416-3 shown in FIG. 4), the third portion being between the support structure and the second portion (i.e., the second portion of the second sidewall of the base being further away from the support structure than the third portion), a portion of the trench opening between a plane parallel to the support structure and aligned with a top of the third portion of the second sidewall of the base and a plane parallel to the support structure and aligned with a bottom of the third portion of the second sidewall of the base is filled with the second dielectric wall material.

Example 19 provides a transistor arrangement that includes a support structure (e.g., a support structure 332 shown in FIG. 4, e.g., a substrate, a chip, or a wafer); a nanoribbon arrangement provided over the support structure, the nanoribbon arrangement including a first semiconductor material, e.g., a semiconductor channel material, shaped as a nanoribbon (e.g., a nanoribbon 420, shown in FIG. 4) having a first face (e.g., a face 422-1, shown in FIG. 4) opposite (i.e., parallel to) the support structure, a second face (e.g., a face 422-2, shown in FIG. 4) opposite the first face, a first sidewall (e.g., a sidewall 424-1, shown in FIG. 4) substantially perpendicular to the support structure, and a second sidewall (e.g., a sidewall 424-2, shown in FIG. 4) opposite the first sidewall (i.e., the nanoribbon extends in a direction substantially parallel to the support structure), and a gate stack provided over a portion of the nanoribbon. The gate stack includes a gate dielectric material (e.g., a gate dielectric material 348, shown in FIG. 4) wrapping around a portion of the nanoribbon between a first plane (e.g., plane 378-1, shown in FIG. 3J) and a second plane (e.g., plane 378-2, shown in FIG. 3J), where each of the first plane and the second plane is substantially perpendicular to each of the support structure and a long axis of the nanoribbon, the second plane being at a distance 382 from the first plane, and a gate electrode material wrapping around the gate dielectric material provided over the first face, the second face, and the first sidewall of the nanoribbon. The transistor arrangement further includes a first dielectric wall material, shaped as a wall substantially perpendicular to the support structure and extending along the second sidewall of the nanoribbon, where the gate dielectric material provided over the second sidewall of the nanoribbon is between, and in contact with, each of the first semiconductor material of the nanoribbon and the first dielectric wall material.

Example 20 provides the transistor arrangement according to example 19, where no portion of the gate electrode material is provided between the second sidewall of the nanoribbon and the first dielectric wall material.

Example 21 provides the transistor arrangement according to examples 19 or 20, where the nanoribbon arrangement is one of a plurality of substantially identical nanoribbon arrangements stacked above one another over the support structure, the gate electrode material wrapping around the gate dielectric material provided over the first face, the second face, and the first sidewall of the nanoribbons of different ones of the plurality of nanoribbon arrangements is electrically continuous among the different ones of the plurality of nanoribbon arrangements, the first dielectric wall material extends along the second sidewall of each nanoribbon of the different ones of the plurality of nanoribbon arrangements, and, for each nanoribbon of the different ones of the plurality of nanoribbon arrangements, the gate dielectric material provided over the second sidewall of the nanoribbon is between, and in contact with each of, the first semiconductor material of the nanoribbon and the first dielectric wall material.

Example 22 provides the transistor arrangement according to any one of examples 19-21, further including a base (e.g., a base 362, shown in FIG. 4) extending away from the support structure, the base having a first face (e.g., a face 412-1, shown in FIG. 4) that is a face opposite (i.e., parallel to) the first face of the nanoribbon, a first sidewall (e.g., a sidewall 414-1, shown in FIG. 4) substantially perpendicular to the support structure, and a second sidewall (e.g., a sidewall 414-2, shown in FIG. 4) opposite the first sidewall, where the second sidewall of the base has a first portion (e.g., a portion 416-1, shown in FIG. 4) and a second portion (e.g., a portion 416-2, shown in FIG. 4), the second portion being between the support structure and the first portion (i.e., the first portion of the second sidewall of the base being further away from the support structure than the second portion), a portion of the gate dielectric material is provided over the first portion of the second sidewall of the base so that the portion of the gate dielectric material is between, and in contact with each of, the base and the first dielectric wall material, a second dielectric wall material is provided over the second portion of the second sidewall of the base so that the second dielectric wall material is between, and in contact with each of, the base and the first dielectric wall material, and the second dielectric wall material is a material that is etch selective with respect to the first dielectric wall material.

Example 23 provides an IC package that includes an IC die and a further IC component, coupled to the IC die. The IC die includes one or more transistor arrangements according to any one of the preceding examples (e.g., each transistor arrangement may be a transistor arrangement according to any one of examples 11-21 and/or may be formed according to a method of any one of examples 1-10).

Example 24 provides the IC package according to example 23, where the further component is one of a package substrate, a flexible substrate, or an interposer.

Example 25 provides the IC package according to examples 23 or 24, where the further component is coupled to the IC die via one or more first level interconnects.

Example 26 provides the IC package according to example 25, where the one or more first level interconnects include one or more solder bumps, solder posts, or bond wires.

Example 27 provides a computing device that includes a circuit board; and an IC die coupled to the circuit board, where the IC die includes one or more of: one or more transistor arrangements according to any one of the preceding examples (e.g., each transistor arrangement may be a transistor arrangement according to any one of examples 11-21 and/or may be formed according to a method of any one of examples 1-10), and the IC package according to any one of the preceding examples (e.g., the IC package according to any one of examples 23-26).

Example 28 provides the computing device according to example 27, where the computing device is a wearable computing device (e.g., a smart watch) or handheld computing device (e.g., a mobile phone).

Example 29 provides the computing device according to examples 27 or 28, where the computing device is a server processor.

Example 30 provides the computing device according to examples 27 or 28, where the computing device is a motherboard.

Example 31 provides the computing device according to any one of examples 27-30, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A transistor arrangement, comprising:
    a substrate;
    a base comprising a face that is opposite the substrate, a first sidewall between the face and the substrate, and a second sidewall opposite the first sidewall;
    a nanoribbon comprising a first semiconductor material and having a longitudinal axis substantially parallel to the substrate, where the base is between the substrate and the nanoribbon;
    a gate insulator-wrapping around a portion of the nanoribbon between a first plane and a second plane, where each of the first plane and the second plane is substantially perpendicular to the longitudinal axis of the nanoribbon; and
    an opening partially filled with a first insulator and partially filled with a second insulator, the opening extending in a direction substantially parallel to the longitudinal axis of the nanoribbon, wherein the second insulator is closer to the substrate than the first insulator and is etch selective with respect to the first insulator.

2. The transistor arrangement according to claim 1, wherein:
    the second sidewall of the base has a first portion and a second portion,
    the second portion is between the substrate and the first portion, and
    no portion of the second insulator is between the first portion of the second sidewall of the base and the first insulator.

3. The transistor arrangement according to claim 1, wherein:
    the second sidewall of the base has a first portion and a second portion,
    the second portion is between the substrate and the first portion, and
    a portion of the opening between a plane parallel to the substrate and aligned with a top of the first portion of the second sidewall of the base and a plane parallel to the substrate and aligned with a bottom of the first portion of the second sidewall of the base further includes a gate electrode material,
    the transistor arrangement further includes the gate insulator between the first portion of the second sidewall of the base and the first insulator, and
    the gate insulator that is between the first portion of the second sidewall of the base and the first insulator is between the first portion of the second sidewall of the base and the gate electrode material.

4. The transistor arrangement according to claim 3, further comprising:
    the gate insulator between the gate electrode material and the first insulator.

5. The transistor arrangement according to claim 1, wherein:
    the second sidewall of the base has a first portion and a second portion,
    the second portion is between the substrate and the first portion,
    the transistor arrangement further includes the gate insulator between the first portion of the second sidewall of the base and the first insulator, and
    the gate insulator that is between the first portion of the second sidewall of the base and the first insulator has a first side that is in contact with the first portion of the second sidewall of the base and has a second side that is in contact with the first insulator.

6. The transistor arrangement according to claim 5, wherein no portion of the opening between a plane parallel to the substrate and aligned with a top of the first portion of the second sidewall of the base and a plane parallel to the substrate and aligned with a bottom of the first portion of the second sidewall of the base includes a gate electrode material.

7. The transistor arrangement according to claim 1, wherein:
    the second sidewall of the base has a first portion and a second portion,
    the second portion is between the substrate and the first portion, and
    no portion of the gate insulator is between the second portion of the second sidewall of the base and the first insulator.

8. The transistor arrangement according to claim 1, wherein:
    the second sidewall of the base has a first portion, a second portion, and a third portion,
    the second portion is between the substrate and the first portion,
    the third portion is between the substrate and the second portion, and
    a portion of the opening between a plane parallel to the substrate and aligned with a top of the third portion of the second sidewall of the base and a plane parallel to the substrate and aligned with a bottom of the third portion of the second sidewall of the base is filled with the second insulator.

9. The transistor arrangement according to claim 1, wherein:
    the second sidewall of the base has a first portion and a second portion,
    the second portion is between the substrate and the first portion, and
    a portion of the second insulator is between the second portion of the second sidewall of the base and the first insulator.

10. The transistor arrangement according to claim 9, further comprising the gate insulator between the first portion of the second sidewall of the base and the first insulator.

11. A transistor arrangement, comprising:
- a nanoribbon comprising a semiconductor material, the nanoribbon having a first face, a second face opposite the first face, a first sidewall between the first face and the second face, and a second sidewall opposite the first sidewall;
- a gate stack over a portion of the nanoribbon, the gate stack comprising:
  - a gate insulator wrapping around a portion of the nanoribbon and having a portion at the second sidewall of the nanoribbon, and
  - a gate electrode material wrapping around the gate insulator; and
- an insulator, shaped as a wall extending along the second sidewall of the nanoribbon,
- wherein the portion of the gate insulator at the second sidewall of the nanoribbon is between, and in contact with, the semiconductor material of the nanoribbon and the insulator.

12. The transistor arrangement according to claim 11, wherein:
- the nanoribbon is one of a plurality of nanoribbons stacked above one another,
- the gate electrode material wrapping around the gate insulator wrapping around the portion of different nanoribbons of the plurality of nanoribbons is electrically continuous among the different nanoribbons of the plurality of nanoribbons,
- the insulator extends along the second sidewall of the different nanoribbons of the plurality of nanoribbons, and
- for each nanoribbon of the plurality of nanoribbons, the portion of the gate insulator at the second sidewall of the nanoribbon is between, and in contact with, the semiconductor material of the nanoribbon and the insulator.

13. An integrated circuit (IC) structure, comprising:
- a plurality of nanoribbons stacked over one another;
- a gate insulator wrapping around portions of different nanoribbons of the plurality of nanoribbons;
- a gate electrode material wrapping around the gate insulator wrapping around the portions of the different nanoribbons of the plurality of nanoribbons;
- an insulator structure extending substantially vertically and along sidewalls of the plurality of nanoribbons; and
- a layer of the gate insulator at a sidewall of the insulator structure that is closest to the sidewalls of the plurality of nanoribbons.

14. The IC structure according to claim 13, wherein the layer of the gate insulator at the sidewall of the insulator structure is in contact with an insulator material of the insulator structure.

15. The IC structure according to claim 14, wherein the layer of the gate insulator at the sidewall of the insulator structure is further in contact with the different nanoribbons of the plurality of nanoribbons.

16. The IC structure according to claim 14, wherein the layer of the gate insulator at the sidewall of the insulator structure is further in contact with the gate electrode material wrapping around the gate insulator wrapping around the portions of the different nanoribbons of the plurality of nanoribbons.

17. The IC structure according to claim 13, wherein:
- the insulator structure includes a first insulator and a second insulator, and
- the second insulator is etch selective with respect to the first insulator.

18. The IC structure according to claim 17, wherein at least a portion of the second insulator is closer to a bottom of a stack of the plurality of nanoribbons than all of the first insulator.

19. The IC structure according to claim 13, wherein:
- the insulator structure includes a first insulator and a second insulator,
- at least a portion of the second insulator is closer to a bottom of a stack of the plurality of nanoribbons than all of the first insulator, and
- a material composition of the second insulator is different from a material composition of the first insulator.

20. The IC structure according to claim 19, wherein a material composition of the gate insulator is different from the material composition of the second insulator or the material composition of the first insulator.

* * * * *